United States Patent
Matsuura

(10) Patent No.: US 11,765,481 B2
(45) Date of Patent: Sep. 19, 2023

(54) IMAGING ELEMENT, PHOTODETECTOR ELEMENT, AND ELECTRONIC EQUIPMENT WITH A THRESHOLD THAT IS RANDOMLY VARIED FOR AN ANALOG-TO-DIGITAL CONVERTER

(71) Applicant: SONY SEMICONDUCTOR SOLUTIONS CORPORATION, Kanagawa (JP)

(72) Inventor: Kouji Matsuura, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 17/755,645

(22) PCT Filed: Oct. 19, 2020

(86) PCT No.: PCT/JP2020/039293
§ 371 (c)(1),
(2) Date: May 4, 2022

(87) PCT Pub. No.: WO2021/095450
PCT Pub. Date: May 20, 2021

(65) Prior Publication Data
US 2022/0394203 A1 Dec. 8, 2022

(30) Foreign Application Priority Data
Nov. 13, 2019 (JP) .................................. 2019-205264

(51) Int. Cl.
*H04N 25/75* (2023.01)
*H04N 25/57* (2023.01)
(Continued)

(52) U.S. Cl.
CPC ............. *H04N 25/75* (2023.01); *H04N 25/57* (2023.01); *H04N 25/709* (2023.01); *H04N 25/77* (2023.01)

(58) Field of Classification Search
CPC ........ H04N 25/75; H04N 5/378; H04N 25/57; H04N 5/355; H04N 25/709; H04N 5/3698;
(Continued)

(56) References Cited

U.S. PATENT DOCUMENTS 9,848,152 B1 * 12/2017 Lin ..................... H03M 1/0639
2016/0006969 A1 1/2016 Matsumoto
2017/0302869 A1 10/2017 Ikuma et al.

FOREIGN PATENT DOCUMENTS

CN 104969539 A 10/2015
CN 107113388 A 8/2017
(Continued)

OTHER PUBLICATIONS

International Search Report and Written Opinion of PCT Application No. PCT/JP2020/039293, dated Dec. 28, 2020, 09 pages of ISRWO.

*Primary Examiner* — Nicholas G Giles
(74) *Attorney, Agent, or Firm* — CHIP LAW GROUP

(57) ABSTRACT

An imaging element of the present disclosure includes an analog-to-digital converter configured to convert multiple analog pixel signals that are acquired under multiple imaging conditions different from each other and that are output from a pixel, to multiple digital pixel signals, a threshold setting unit configured to set, on an input side of the analog-to-digital converter, a threshold that is randomly varied, a comparison unit configured to use, as a comparison threshold, the threshold set by the threshold setting unit and compare the comparison threshold with one of the multiple analog pixel signals, and a selection unit configured to select
(Continued)

and output, on the basis of a result of comparison from the comparison unit, one of the multiple digital pixel signals that are output from the analog-to-digital converter.

20 Claims, 35 Drawing Sheets

(51) Int. Cl.
*H04N 25/77* (2023.01)
*H04N 25/709* (2023.01)

(58) Field of Classification Search
CPC .... H04N 25/77; H04N 5/3745; H04N 23/741; H04N 5/2355; H04N 25/616; H04N 5/3575; H04N 25/65; H04N 5/363; H04N 25/76; H04N 5/374; H04N 25/78; H01L 27/146

See application file for complete search history.

(56) References Cited

FOREIGN PATENT DOCUMENTS

| | | |
|---|---|---|
| DE | 202014011038 U1 | 7/2017 |
| EP | 2963918 A1 | 1/2016 |
| EP | 3253047 A1 | 12/2017 |
| JP | 04-172086 A | 6/1992 |
| JP | 2016-174219 A | 9/2016 |
| KR | 10-2015-0122636 A | 11/2015 |
| TW | 201436571 A | 9/2014 |
| WO | 2014/132822 A1 | 9/2014 |
| WO | 2016/121352 A1 | 8/2016 |

* cited by examiner

F I G . 1
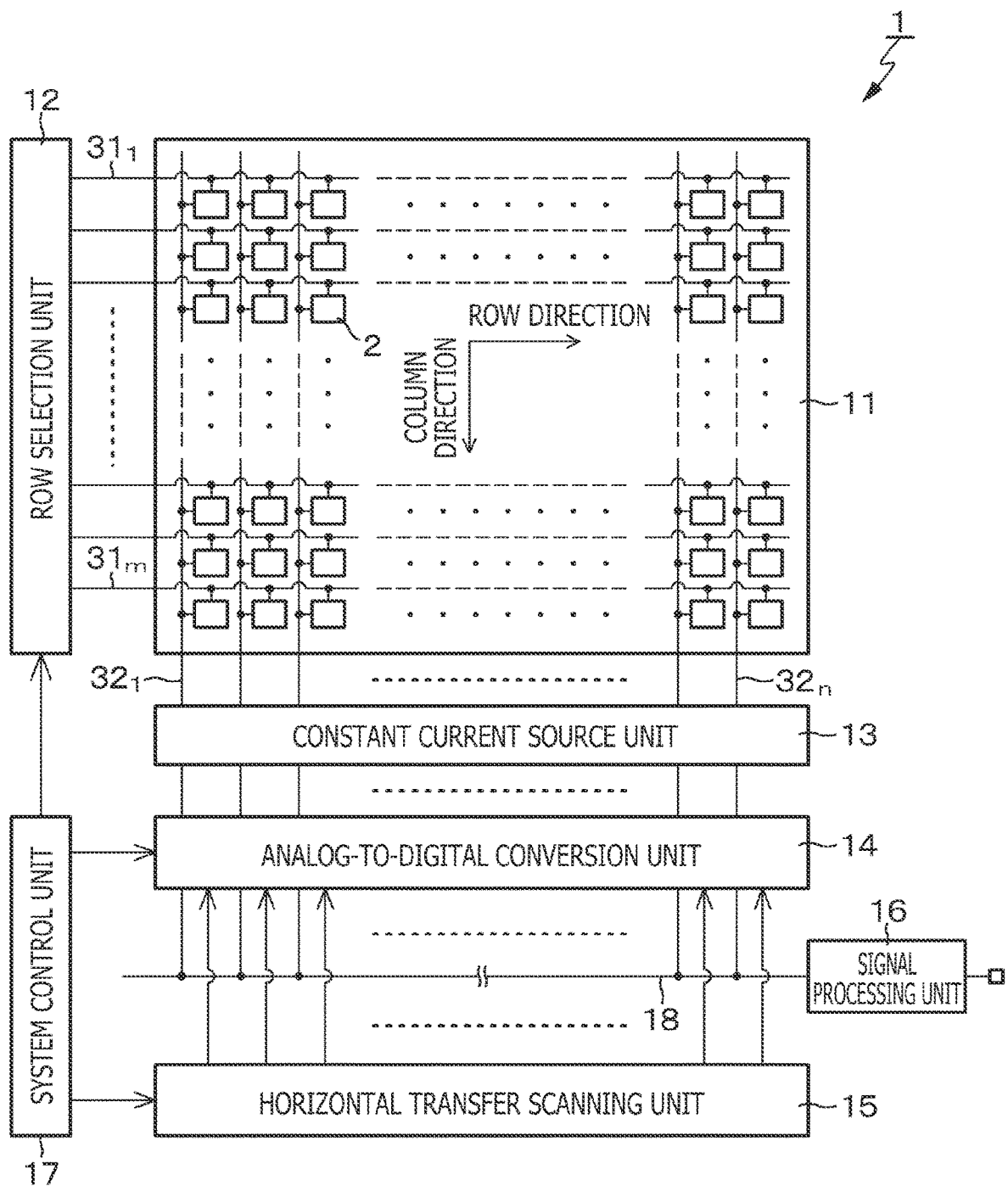

IMAGING ELEMENT, PHOTODETECTOR ELEMENT, AND ELECTRONIC EQUIPMENT WITH A THRESHOLD THAT IS RANDOMLY VARIED FOR AN ANALOG-TO-DIGITAL CONVERTER

CROSS REFERENCE TO RELATED APPLICATIONS

This application is a U.S. National Phase of International Patent Application No. PCT/JP2020/039293 filed on Oct. 19, 2020, which claims priority benefit of Japanese Patent Application No. JP 2019-205264 filed in the Japan Patent Office on Nov. 13, 2019. Each of the above-referenced applications is hereby incorporated herein by reference in its entirety.

TECHNICAL FIELD

The present disclosure relates to an imaging element, a photodetector element, and electronic equipment.

BACKGROUND ART

There is a technology that controls an imaging element to acquire two images with different exposures and combine the acquired two images to expand a dynamic range (dynamic range expansion). In the case of this dynamic range expansion technology, there is a problem that a pseudo image is generated at the boundary between the two images and the image quality is thus deteriorated.

Hitherto, in order to implement dynamic range expansion, two image signals acquired with different exposures are subjected to analog-to-digital conversion, and then, one of the two image signals is selected on the basis of the magnitude relation between the image signals and a threshold that probabilistically changes, to thereby improve a pseudo image (for example, see PTL 1).

CITATION LIST

Patent Literature

[PTL 1]
Japanese Patent Laid-open No. Hei 4-172086

SUMMARY

Technical Problems

With regard to the related art described in PTL 1 above, two image signals that have been subjected to analog-to-digital conversion are assigned on the basis of a threshold that is varied with a random number and a dither. Therefore, there is a concern that, in a case where the random number has periodicity, a pseudo image is generated due to the periodicity and the image quality is thus deteriorated. Further, in a case where the application of the technology to an imaging element that includes an analog-to-digital converter in each pixel column, for example, is intended, a comparator and a register configured to hold a threshold are to be provided in each pixel column. Accordingly, the circuit scale and the power consumption increase as the number of pixel columns or the number of bits in analog-to-digital conversion increases.

It is an object of the present disclosure to provide an imaging element, a photodetector element, and electronic equipment including the imaging element that can prevent, when dynamic range expansion is to be implemented, the generation of a pseudo image to acquire a high-quality image as compared to the technology using a threshold varied with a random number and a dither, and that can also prevent increases in circuit scale and power consumption.

Solution to Problems

In order to achieve the object described above, according to the present disclosure, there is provided an imaging element including an analog-to-digital converter configured to convert multiple analog pixel signals that are acquired under multiple imaging conditions different from each other and that are output from a pixel, to multiple digital pixel signals, a threshold setting unit configured to set, on an input side of the analog-to-digital converter, a threshold that is randomly varied, a comparison unit configured to use, as a comparison threshold, the threshold set by the threshold setting unit and compare the comparison threshold with one of the multiple analog pixel signals, and a selection unit configured to select and output, on the basis of a result of comparison from the comparison unit, one of the multiple digital pixel signals that are output from the analog-to-digital converter.

Further, in order to achieve the object described above, according to the present disclosure, there is provided a photodetector element including an analog-to-digital converter configured to convert multiple analog pixel signals that are acquired under multiple imaging conditions different from each other and that are output from a pixel, to multiple digital pixel signals, a threshold setting unit configured to set, on an input side of the analog-to-digital converter, a threshold that is randomly varied, a comparison unit configured to use, as a comparison threshold, the threshold set by the threshold setting unit and compare the comparison threshold with one of the multiple analog pixel signals, and a selection unit configured to select and output, on the basis of a result of comparison from the comparison unit, one of the multiple digital pixel signals that are output from the analog-to-digital converter.

Further, in order to achieve the object described above, according to the present disclosure, there is provided electronic equipment including the imaging element having the configuration described above.

BRIEF DESCRIPTION OF DRAWINGS

FIG. 1 is a block diagram illustrating the schematic basic configuration of a CMOS image sensor that is an example of an imaging element to which a technology according to the present disclosure is applied.

FIG. 12A illustrates an example in which a PMOS tail current is controlled, and FIG. 12B illustrates an example in which an NMOS tail current is controlled.

DESCRIPTION OF EMBODIMENT

Figure 2:
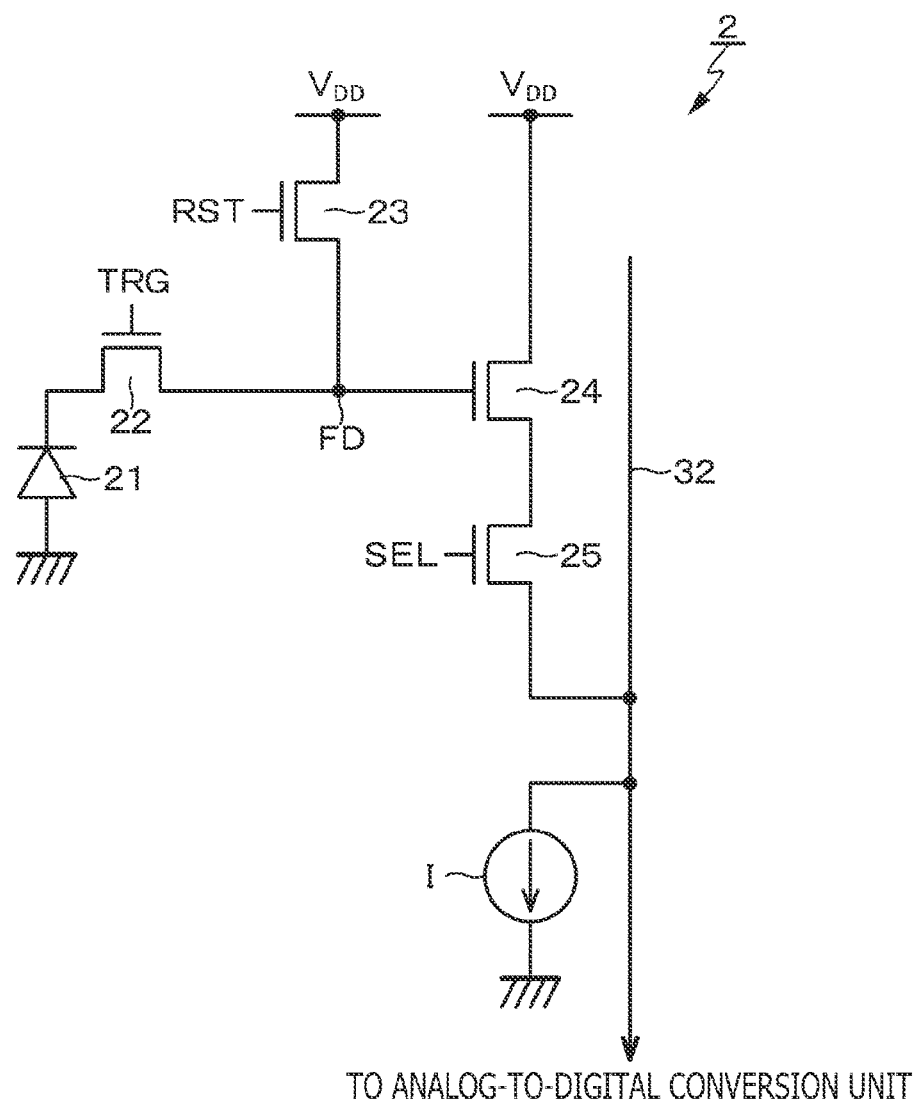
FIG. 2 is a circuit diagram illustrating an exemplary circuit configuration of a pixel.

Now, a mode for carrying out a technology according to the present disclosure (hereinafter referred to as an "embodiment") is described in detail with reference to the drawings. The technology according to the present disclosure is not limited to the embodiment. In the following description, the same elements or elements having the same function are denoted by the same reference signs, and the redundant description is omitted. Note that description is given in the following order.

1. General description regarding imaging element, photodetector element, and electronic equipment of present disclosure
2. Imaging element to which technology according to present disclosure is applied
  2-1. Configuration example of CMOS image sensor
  2-2. Circuit configuration example of pixel
  2-3. Configuration example of analog-to-digital conversion unit
  2-4. Dynamic range expansion
3. Embodiment of present disclosure
  3-1. First example [example in which one single-slope analog-to-digital converter images same object at conversion efficiencies different from each other]
    3-1-1. First exemplary technique of adjusting determination threshold (example in which high conversion efficiency auto-zero period is controlled)
    3-1-2. Second exemplary technique of adjusting determination threshold (example in which bias current $I_{bias}$ in comparator is controlled)

3-1-3. Third exemplary technique of adjusting determination threshold (example in which size of differential pair transistors included in comparator is changed)

3-2. Second example [modified example of first example: example in which two single-slope analog-to-digital converters are provided in parallel]

3-3. Third example [example of adaptive attenuation single-slope analog-to-digital converter]

3-4. Fourth example [example in which one single-slope analog-to-digital converter images same object with analog gains different from each other]

3-5. Fifth example [modified example of fourth example: example in which two single-slope analog-to-digital converters are provided in parallel]

3-6. Sixth example [modified example of second example: example in which conversion efficiency determination threshold is varied by using variation of potentials of reset signal and data signal of each pixel]

3-7. Seventh example [modified example of sixth example: example in which same object is imaged with analog gains different from each other]

4. Modified examples

5. Application examples

6. Application examples of technology according to present disclosure 6-1. Electronic equipment of present disclosure (example of imaging element)

7. Configurations that present disclosure can take

<General Description Regarding Imaging Element, Photodetector Element, and Electronic Equipment of Present Disclosure>

With regard to an imaging element, a photodetector element, and electronic equipment of the present disclosure, an analog-to-digital converter can be a single-slope analog-to-digital converter configured to perform analog-to-digital conversion by using a ramp waveform reference signal having a voltage value that changes over time. Further, the single-slope analog-to-digital converter can include a comparator configured to compare multiple analog pixel signals that are output from a pixel, with the ramp waveform reference signal, and a counter configured to measure a period of time from a start time when the comparator starts the comparison operation to an end time when the comparator ends the comparison operation.

With regard to the imaging element, the photodetector element, and the electronic equipment of the present disclosure that have the preferred configuration described above, a threshold setting unit can set a randomly varied threshold by controlling an auto-zero period in which input and output terminals of the comparator are short-circuited, set the randomly varied threshold by controlling a bias current in the comparator, or set the randomly varied threshold by changing a size ratio (channel width/channel length) of differential pair transistors included in the comparator.

Further, with regard to the imaging element, the photodetector element, and the electronic equipment of the present disclosure that have the preferred configuration described above, the same object can sequentially be imaged by using a single pixel while an imaging condition is changed, to acquire multiple analog pixel signals, or the same object can simultaneously be imaged by using multiple pixels having different imaging conditions, to acquire multiple analog pixel signals. The imaging condition can be an exposure, an exposure time, conversion efficiency with which a charge is converted to a voltage, or sensitivity of the pixel.

Further, with regard to the imaging element, the photodetector element, and the electronic equipment of the present disclosure that have the preferred configuration described above, when the multiple imaging conditions include high conversion efficiency and low conversion efficiency and when the pixel sequentially outputs a reset signal at a reset level of a floating diffusion FD being reset and a data signal at a signal level based on photoelectric conversion performed by a light receiving element, the single-slope analog-to-digital converter can perform an operation of acquiring a count value of the reset signal at low conversion efficiency from the counter to temporarily hold the count value and restoring the count value to the counter before counting a D phase signal at low conversion efficiency. Alternatively, the single-slope analog-to-digital converter can include two sets of a comparator and a counter in each pixel column, the two sets being arranged in parallel.

Further, with regard to the imaging element, the photodetector element, and the electronic equipment of the present disclosure that have the preferred configuration described above, the single-slope analog-to-digital converter can be an adaptive attenuation analog-to-digital converter configured to attenuate, when an amplitude of each of the analog pixel signals that are output from the pixel is relatively large, the amplitude by a predetermined amount to compress a dynamic range. In addition, the adaptive attenuation analog-to-digital converter can include, on an input side of the comparator, a sample-and-hold circuit configured to sample and hold the reset signal at low conversion efficiency.

Further, with regard to the imaging element, the photodetector element, and the electronic equipment of the present disclosure that have the preferred configuration described above, when the imaging conditions include an analog gain of the analog-to-digital converter, a single analog-to-digital converter can sequentially perform analog-to-digital conversion while changing the analog gain, or multiple analog-to-digital converters having different analog gains can simultaneously perform analog-to-digital conversion.

Further, with regard to the imaging element, the photodetector element, and the electronic equipment of the present disclosure that have the preferred configuration described above, when the multiple imaging conditions include a high analog gain and a low analog gain and when the pixel sequentially outputs a reset signal corresponding to a floating diffusion FD being reset and a data signal based on photoelectric conversion performed by a light receiving element, the single-slope analog-to-digital converter can perform an operation of acquiring a count value of the reset signal with a low analog gain from the counter to temporarily hold the count value and restoring the count value to the counter before counting the data signal with a low analog gain. Alternatively, the single-slope analog-to-digital converter can include two sets of a comparator and a counter in each pixel column, the two sets being arranged in parallel.

Further, with regard to the imaging element, the photodetector element, and the electronic equipment of the present disclosure that have the preferred configuration described above, when the pixel sequentially outputs a reset signal corresponding to a floating diffusion FD being reset and a data signal based on photoelectric conversion performed by a light receiving element, the threshold setting unit can set the randomly varied threshold by using a variation of potentials of the reset signal and the data signal of each pixel.

Further, with regard to the imaging element, the photodetector element, and the electronic equipment of the present disclosure that have the preferred configuration described above, when the multiple imaging conditions include high conversion efficiency and low conversion efficiency, the single-slope analog-to-digital converter can include a high conversion efficiency analog-to-digital converter and a low conversion efficiency analog-to-digital converter. In addition, the high conversion efficiency analog-to-digital converter and the low conversion efficiency analog-to-digital converter can each include a D (data) phase count value latch, a comparison unit for determining a level of output of the latch, and a selector configured to select, on the basis of a result of comparison from the comparison unit, either output of the high conversion efficiency analog-to-digital converter or output of the low conversion efficiency analog-to-digital converter.

Further, with regard to the imaging element, the photodetector element, and the electronic equipment of the present disclosure that have the preferred configuration described above, when the multiple imaging conditions include a high analog gain and a low analog gain, the single-slope analog-to-digital converter can include a high-analog-gain analog-to-digital converter and a low analog gain analog-to-digital converter. In addition, the high-analog-gain analog-to-digital converter and the low analog gain analog-to-digital converter can each include a D phase count value latch, a comparison unit for determining a level of output of the latch, and a selector configured to select, on the basis of a result of comparison from the comparison unit, either output of the high-analog-gain analog-to-digital converter or output of the low analog gain analog-to-digital converter.

<Imaging Element to which Technology According to Present Disclosure is Applied>

The basic configuration of an imaging element to which the technology according to the present disclosure is applied is described. Here, as the imaging element, a CMOS (Complementary Metal Oxide Semiconductor) image sensor which is a kind of X-Y address imaging element is exemplified. The CMOS image sensor is an image sensor manufactured by applying or partially using a CMOS process.

[Configuration Example of CMOS Image Sensor]

FIG. 1 is a block diagram illustrating the schematic basic configuration of the CMOS image sensor that is an example of the imaging element to which the technology according to the present disclosure is applied.

A CMOS image sensor 1 according to this example includes a pixel array unit 11 and peripheral circuits disposed around the pixel array unit 11. The pixel array unit 11 includes pixels 2 that include light receiving elements (photoelectric conversion elements) and that are arranged in a row direction and a column direction, that is, are two-dimensionally arranged in a matrix. Here, the row direction means an array direction of the pixels 2 in a pixel row, and the column direction means an array direction of the pixels 2 in a pixel column. The pixel 2 performs photoelectric conversion to generate a photoelectric charge based on the amount of received light and accumulates the photoelectric charges.

The peripheral circuits disposed around the pixel array unit 11 include, for example, a row selection unit 12, a constant current source unit 13, an analog-to-digital conversion unit 14, a horizontal transfer scanning unit 15, a signal processing unit 16, a timing control unit 17, and the like.

As for the array of pixels in a matrix form in the pixel array unit 11, pixel control lines $31_1$ to $31_m$ (hereinafter sometimes collectively referred to as a "pixel control line 31") are disposed in the respective pixel rows along the row direction. Further, vertical signal lines $32_1$ to $32_n$ (hereinafter sometimes collectively referred to as a "vertical signal line 32") are disposed in the respective pixel columns along the column direction. The pixel control line 31 transmits a drive signal for driving when a signal is to be read from the pixel 2. The pixel control line 31 is illustrated as a single wire in FIG. 1 but is not limited to the single wire. One end of the pixel control line 31 is connected to an output terminal of the row selection unit 12 which corresponds to each row.

Now, circuit portions of the peripheral circuits disposed around the pixel array unit 11, that is, the row selection unit 12, the constant current source unit 13, the analog-to-digital conversion unit 14, the horizontal transfer scanning unit 15, the signal processing unit 16, and the timing control unit 17, are described.

The row selection unit 12 includes a shift register, an address decoder, or the like and controls, when selecting the pixel 2 of the pixel array unit 11, pixel row scanning and the pixel row address. Although a specific configuration of the row selection unit 12 is not illustrated herein, the row selection unit 12 generally includes two scanning systems, that is, a read-out scanning system and a sweep scanning system.

The read-out scanning system sequentially selects and scans the pixels 2 of the pixel array unit 11 row by row in order to read a pixel signal from the pixel 2. The pixel signal read from the pixel 2 is an analog signal. Before read-out scanning is performed by the read-out scanning system, the sweep scanning system performs sweep scanning on a row which is to be subjected to the read-out scanning. The difference between the time when the sweep scanning starts and the time when the read-out scanning starts is equal to the shutter speed.

Since the sweep scanning is performed by the sweep scanning system, unnecessary charges are swept out from the photoelectric conversion unit of the pixel 2 in the row to be read. The photoelectric conversion unit is thus reset. Further, when unnecessary charges are swept out (reset) by the sweep scanning system, what is called an electronic shutter operation is performed. Here, the electronic shutter operation is an operation of discarding the photoelectric charges of the photoelectric conversion unit and starting a new exposure (starting to accumulate photoelectric charges).

The constant current source unit 13 includes multiple current sources I. Each of the current sources I has, for example, a MOS field effect transistor and is connected to a corresponding one of the vertical signal lines $32_1$ to $32_n$ in each pixel column. The constant current source unit 13 supplies a bias current to each pixel 2 in the pixel row selected and scanned by the row selection unit 12, through a corresponding one of the vertical signal lines $32_1$ to $32_n$.

The analog-to-digital conversion unit 14 includes a set of multiple analog-to-digital converters that correspond to the respective pixel columns of the pixel array unit 11. For example, the analog-to-digital converter is provided in each pixel column. The analog-to-digital conversion unit 14 is a column-parallel analog-to-digital conversion unit configured to convert, in each pixel column, an analog pixel signal output through a corresponding one of the vertical signal lines $32_1$ to $32_n$, to an N-bit digital signal.

As the analog-to-digital converter in the column-parallel analog-to-digital conversion unit 14, a single-slope analog-to-digital converter that is an example of a reference signal comparison analog-to-digital converter can be used, for example. The details of the single-slope analog-to-digital converter are described later.

The horizontal transfer scanning unit 15 includes a shift register, an address decoder, or the like. When reading a signal from each pixel 2 of the pixel array unit 11, the horizontal transfer scanning unit 15 controls pixel column scanning and the pixel column address. Under the control of the horizontal transfer scanning unit 15, a pixel signal that has been converted to a digital signal by the analog-to-digital conversion unit 14 is read to a horizontal transfer line 18 having a 2N-bit width, in units of pixel column.

The signal processing unit 16 performs predetermined signal processing on a digital pixel signal supplied through the horizontal transfer line 18, to generate two-dimensional image data. For example, the signal processing unit 16 corrects vertical line defects or point defects, clamps signals, or performs digital signal processing such as parallel-to-serial conversion, compression, encoding, addition, averaging, and an intermittent operation. The signal processing unit 16 outputs the generated image data to a subsequent apparatus as an output signal of the CMOS image sensor 1.

The timing control unit 17 generates various timing signals, clock signals, control signals, and the like. On the basis of these generated signals, the timing control unit 17 drives and controls the row selection unit 12, the constant current source unit 13, the analog-to-digital conversion unit 14, the horizontal transfer scanning unit 15, the signal processing unit 16, and the like.

[Circuit Configuration Example of Pixel]

FIG. 2 is a circuit diagram illustrating an exemplary circuit configuration of the pixel 2. The pixel 2 includes, for example, a photodiode 21 as a light receiving element (photoelectric conversion element). The pixel 2 has such a pixel configuration that includes, in addition to the photodiode 21, a transfer transistor 22, a reset transistor 23, an amplification transistor 24, and a selection transistor 25.

As the four transistors including the transfer transistor 22, the reset transistor 23, the amplification transistor 24, and the selection transistor 25, N-channel MOS field effect transistors (FET) are used, for example. As the pixel 2 only includes the NMOS transistors, optimization can be achieved in terms of area efficiency and reduction in processing steps. However, the combination of conductivity types of the four transistors 22 to 25 exemplified herein is merely an example, and the combination of conductivity types is not limited to the exemplified combination.

As the above-mentioned pixel control lines 31, multiple control lines are provided for the pixels 2. The control line is shared by the pixels 2 in the same pixel row. The multiple control lines are connected to the output terminals of the row selection unit 12 which correspond to the respective pixel rows, in units of pixel row. The row selection unit 12 appropriately outputs a transfer signal TRG, a reset signal RST, and a selection signal SEL to the multiple control lines.

An anode electrode of the photodiode 21 is connected to a power source on the low potential side (for example, ground). The photodiode 21 photoelectrically converts received light to a photoelectric charge (here, a photoelectron) having a charge amount corresponding to the amount of the received light and accumulates the photoelectric charges. A cathode electrode of the photodiode 21 is electrically connected to a gate electrode of the amplification transistor 24 via the transfer transistor 22. Here, a region to which the gate electrode of the amplification transistor 24 is electrically connected is a floating diffusion (floating diffusion region/impurity diffusion region) FD. The floating diffusion FD is a charge-to-voltage conversion unit configured to convert a charge to a voltage.

The row selection unit 12 applies the transfer signal TRG that is active at the high level (for example, $V_{DD}$ level), to a gate electrode of the transfer transistor 22. The transfer transistor 22 enters a conductive state in response to the transfer signal TRG, thereby transferring, to the floating diffusion FD, photoelectric charges obtained by photoelectric conversion by the photodiode 21 and accumulated in the photodiode 21.

The reset transistor 23 is disposed between a node of a power source voltage $V_{DD}$ and the floating diffusion FD and connected thereto. The row selection unit 12 applies the reset signal RST that is active at the high level, to a gate electrode of the reset transistor 23. The reset transistor 23 enters a conductive state in response to the reset signal RST and resets the floating diffusion FD by discarding the charges in the floating diffusion FD to the node of the voltage $V_{DD}$.

The gate electrode of the amplification transistor 24 is connected to the floating diffusion FD, and a drain electrode of the amplification transistor 24 is connected to the node of the power source voltage $V_{DD}$. The amplification transistor 24 is an input unit of a source follower that is configured to read a signal obtained by photoelectric conversion by the photodiode 21. That is, a source electrode of the amplification transistor 24 is connected to the vertical signal line 32 via the selection transistor 25. Further, the amplification transistor 24 and the current source I connected to one end of the vertical signal line 32 form a source follower configured to convert a voltage in the floating diffusion FD to a potential of the vertical signal line 32.

A drain electrode of the selection transistor 25 is connected to the source electrode of the amplification transistor 24, and a source electrode of the selection transistor 25 is connected to the vertical signal line 32. The row selection unit 12 applies the selection signal SEL that is active at the high level, to a gate electrode of the selection transistor 25. The selection transistor 25 enters a conductive state in response to the selection signal SEL, and the pixel 2 is thus in the selected state. Then, the selection transistor 25 transmits a signal output from the amplification transistor 24, to the vertical signal line 32.

Note that the selection transistor 25 can be disposed between the node of the power source voltage $V_{DD}$ and the drain electrode of the amplification transistor 24 and connected thereto. Further, in the present example, as the pixel circuit of the pixel 2, the 4Tr configuration including the four transistors (Tr), that is, the transfer transistor 22, the reset transistor 23, the amplification transistor 24, and the selection transistor 25, is exemplified. The pixel circuit is, however, not limited to the 4Tr configuration. For example, a 3Tr configuration in which the selection transistor 25 is omitted and in which the amplification transistor 24 has the function of the selection transistor 25 can be used, or a configuration including five or more transistors can be used as needed.

[Configuration Example of Analog-to-Digital Conversion Unit]

Figure 3:
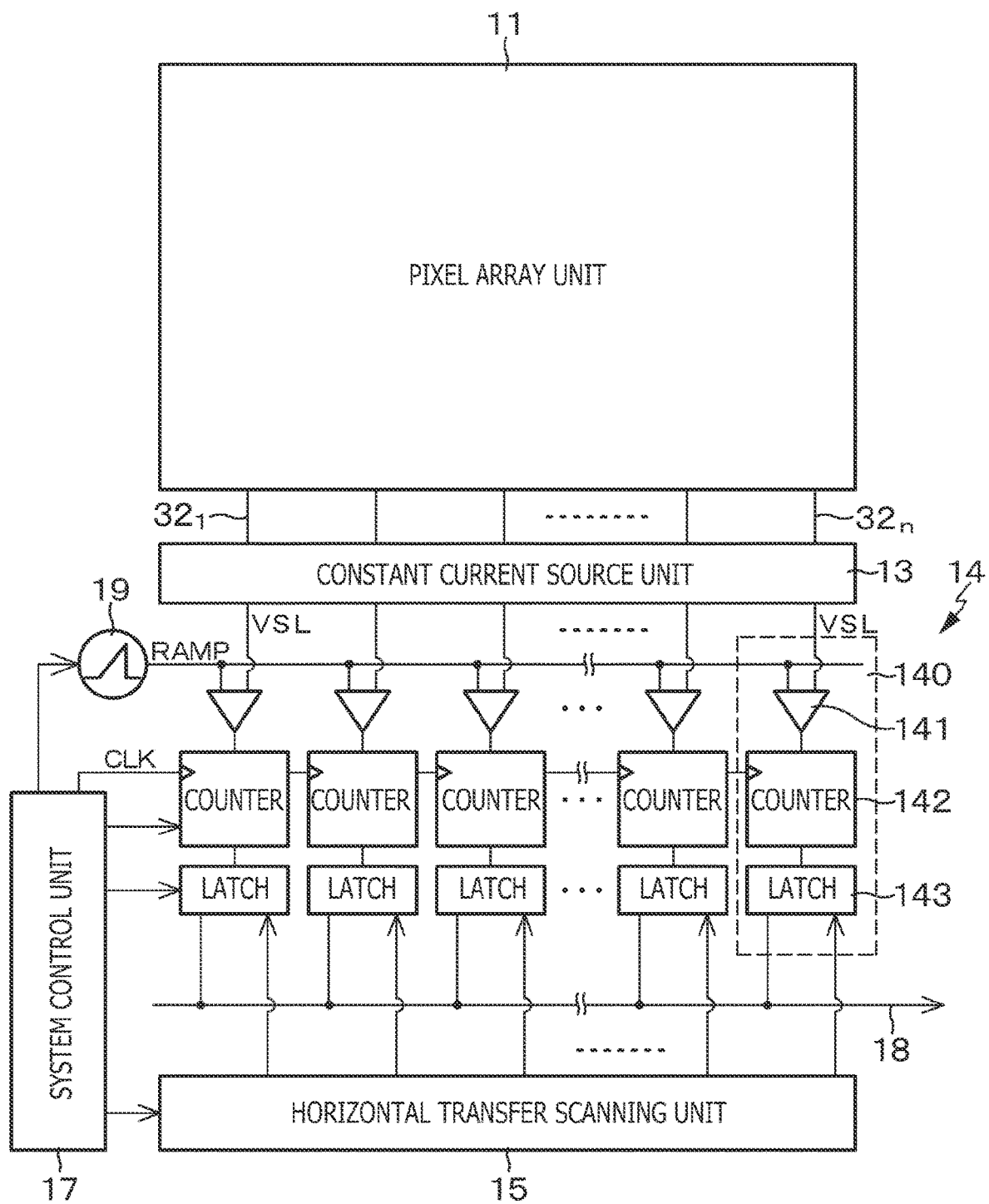
FIG. 3 is a block diagram illustrating an exemplary configuration of a column-parallel analog-to-digital conversion unit that is mounted on the CMOS image sensor.

Next, a configuration example of the column-parallel analog-to-digital conversion unit 14 is described. FIG. 3 is a block diagram illustrating an exemplary configuration of the column-parallel analog-to-digital conversion unit 14. The analog-to-digital conversion unit 14 in the CMOS image sensor 1 of the present example includes a set of multiple single-slope analog-to-digital converters that correspond to the respective vertical signal lines $32_1$ to $32_n$. Here, a single-slope analog-to-digital converter 140 in the n-th column is exemplified.

The single-slope analog-to-digital converter 140 has such a circuit configuration that includes a comparator 141, a counter 142, and a data latch 143. The single-slope analog-to-digital converter 140 uses a reference signal having what is called a ramp waveform in which a voltage value linearly changes over time. The ramp waveform reference signal is generated by a reference signal generation unit 19. The reference signal generation unit 19 can be configured with a DAC (digital-to-analog conversion) circuit, for example.

The comparator 141 compares a comparison input that is an analog pixel signal read from the pixel 2, with a reference input that is the ramp waveform reference signal generated by the reference signal generation unit 19. Then, for example, the comparator 141 outputs a signal in a first state (for example, high level) when the reference signal is larger than the pixel signal, and outputs a signal in a second state (for example, low level) when the reference signal is equal to or smaller than the pixel signal. With this, the comparator 141 outputs, as a comparison result, a pulse signal having a pulse width corresponding to the signal level of the pixel signal, specifically, corresponding to the magnitude of the signal level.

The counter 142 receives a clock signal CLK from the timing control unit 17 at the same timing as the timing of the start of the supply of the reference signal to the comparator 141. Then, the counter 142 performs a count operation in synchronization with the clock signal CLK to measure the period of the pulse width of the output pulse of the comparator 141, that is, the period of time from the start of the comparison operation to the end of the comparison operation. The count result (count value) from the counter 142 is a digital value obtained by digitizing an analog pixel signal.

In the CMOS image sensor 1, noise removal processing is generally performed by correlated double sampling (CDS) to remove noise in the reset operation of the pixel 2. To implement the CDS processing, the pixel 2 outputs a reset signal (hereinafter referred to as a "P phase signal") at a reset level of the floating diffusion FD reset by the reset transistor 23 and a data signal (hereinafter referred to as a "D phase signal") at a signal level based on photoelectric conversion by the photodiode 21.

Here, as an example, the counter 142 performs the CDS processing. Specifically, the counter 142 includes, for example, an up/down counter and takes a difference between a P phase signal and a D phase signal in an up/down count operation, to thereby perform the CDS processing in the count operation of the counter 142. CDS data that has been subjected to the CDS processing in the counter 142 is latched by the data latch 143 and is then output to the horizontal transfer line 18 by being driven by the horizontal transfer scanning unit 15.

As described above, in the column-parallel analog-to-digital conversion unit 14 including the set of the single-slope analog-to-digital converters 140, a digital value is obtained from information regarding the time required to change the magnitude relation between the reference signal that has the linearly changing analog value and that is generated by the reference signal generation unit 19 and an analog pixel signal that is output from the pixel 2. Note that, although the analog-to-digital conversion unit 14 in which the analog-to-digital converters 140 and the pixel columns are arranged in a one-to-one correspondence is exemplified in the example described above, the analog-to-digital conversion unit 14 in which the analog-to-digital converters 140 are arranged in units of multiple pixel columns can also be adopted.

[Dynamic Range Expansion]

With regard to imaging elements typified by the CMOS image sensor 1 having the configuration described above, as one of technologies for implementing dynamic range expansion, there is a technology that acquires multiple images, for example, two images, under different imaging conditions and then combines the acquired two images to thereby implement dynamic range expansion.

In the case of this dynamic range expansion technology, there is a problem that a pseudo image is generated at the boundary between the two images and the image quality is thus deteriorated. To solve this problem, there has been employed a technique that performs analog-to-digital conversion on acquired two image signals and then assigns the two image signals which have been subjected to the analog-to-digital conversion, on the basis of a threshold which is varied with a random number and a dither on the output side of the analog-to-digital converter, that is, in the digital region.

However, even in the case of the technique described above, there is a concern that, in a case where the random number has periodicity, a pseudo image is generated due to the periodicity and the image quality is thus deteriorated. Further, in a case where the application of the technique to the CMOS image sensor 1 having the configuration described above, that is, to the imaging element including the analog-to-digital converter in each pixel column, for example, is intended, values different among the pixel columns need to be set as thresholds, and a register configured to hold a threshold thus needs to be provided in each pixel column. Therefore, the circuit scale and the power consumption increase as the number of pixel columns or the number of bits in analog-to-digital conversion increases.

EMBODIMENT OF PRESENT DISCLOSURE

In the CMOS image sensor 1 according to an embodiment of the present disclosure that includes, in each pixel column, an analog-to-digital converter such as the single-slope analog-to-digital converter 140 which is configured to convert, to a digital pixel signal, an analog pixel signal output from the pixel 2, the same object is imaged under multiple imaging conditions different from each other to acquire multiple images with the different imaging conditions. In the following description, it is assumed that the number of the multiple imaging conditions is two and that the number of the multiple images is two. In this case, the two analog-to-digital converters 140 are provided in each pixel column in association with the two imaging conditions. However, the number of the multiple imaging conditions and the number of the multiple images are not limited to two.

With the configuration described above, when two analog pixel signals that are acquired under the two imaging conditions different from each other are output from the pixel 2, two analog-to-digital converters $140_{-1}$ and $140_{-2}$ convert the two analog pixel signals to two digital pixel signals. In the following, the analog-to-digital converters $140_{-1}$ and $140_{-2}$ are referred to as A/D converters $140_{-1}$ and $140_{-2}$.

In the embodiment of the present disclosure, a randomly varied threshold is set on the input side of one of the A/D converters $140_{-1}$ and $140_{-2}$, and the set threshold is used as the comparison threshold of a comparison unit. Then, one of two digital pixel signals output from the A/D converters $140_{-1}$ and $140_{-2}$ is selected and output on the basis of the result of comparison from the comparison unit.

Figure 4:
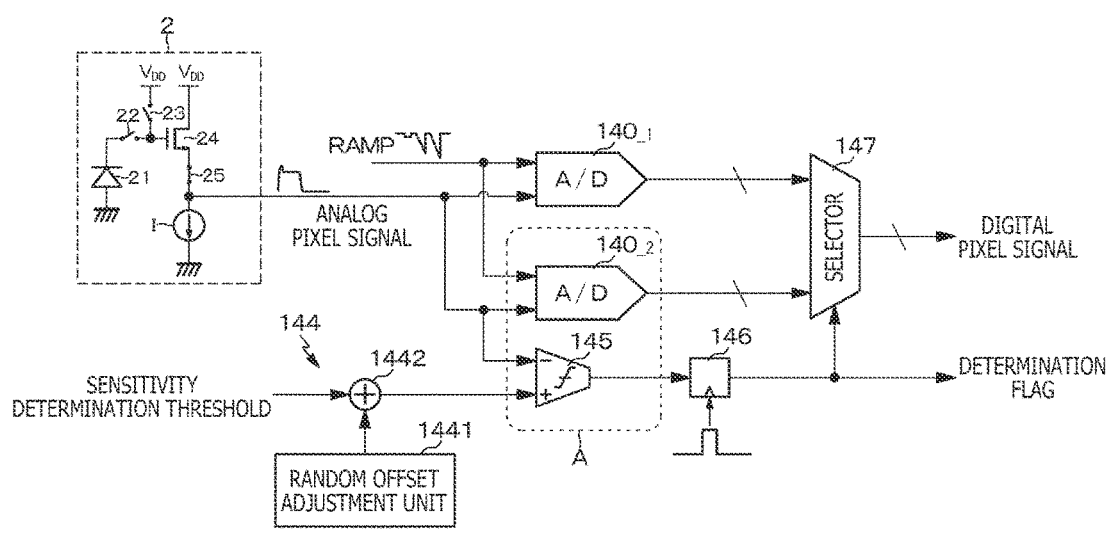
FIG. 4 is a block diagram illustrating the basic form of a signal processing unit configured to perform signal processing for dynamic range expansion in a CMOS image sensor according to an embodiment of the present disclosure.

FIG. 4 is a block diagram illustrating the basic form of a signal processing unit configured to perform signal processing for dynamic range expansion in the CMOS image sensor 1 according to the embodiment of the present disclosure.

The CMOS image sensor 1 according to the present embodiment includes a threshold setting unit 144, a comparison unit 145, a determination flag storage latch 146, and a selector 147 in addition to the A/D converters $140_{-1}$ and $140_{-2}$ configured to convert two analog pixel signals that are acquired under the two imaging conditions different from each other and that are sequentially output from the pixel 2, to digital pixel signals.

The threshold setting unit 144 sets a sensitivity determination threshold as the comparison threshold of the comparison unit 145. Specifically, the threshold setting unit 144 includes a random offset adjustment unit 1441 and an adder 1442. The adder 1442 superimposes a random offset that is randomly varied by the random offset adjustment unit 1441, on a determination threshold given from the outside. Thus, the threshold that is randomly varied in an analog manner is set as the sensitivity determination threshold.

The comparison unit 145 is a comparison unit for performing a sensitivity determination. The comparison unit 145 uses, as the comparison threshold, the sensitivity determination threshold that is set by the threshold setting unit 144 and that is randomly varied in an analog manner, and compares the comparison threshold with, for example, a high sensitivity output (analog pixel signal) that is output from the pixel 2. Thus, a high sensitivity output/low sensitivity output determination is made. The result of comparison from the comparison unit 145, that is, a high sensitivity output/low sensitivity output determination flag, is latched by the determination flag storage latch 146.

The selector 147 is a selection unit configured to select one of two digital pixel signals output from the A/D converters $140_{-1}$ and $140_{-2}$. The selector 147 selects and outputs one of two digital pixel signals on the basis of a high sensitivity output/low sensitivity output determination flag latched by the determination flag storage latch 146.

In the signal processing unit having the configuration described above, a circuit portion A surrounded by the dotted rectangle, that is, the A/D converter $140_{-2}$, which is one of the A/D converters, and the comparison unit 145 for performing a sensitivity determination, can be integrated with each other in a case where the analog-to-digital converter 140 is a single-slope A/D converter. Note that, even in the case of the single-slope A/D converter, the A/D converter $140_{-2}$ and the comparison unit 145 may be the individual components as illustrated in FIG. 4.

In the single-slope A/D converter 140, the counter 142 (see FIG. 3) performs the count operation according to the number of bits, and therefore, the difficulty lies in accelerating the operation. In order to achieve acceleration of the operation, what is called adaptive gain control that adaptively adjusts a gain is performed. Specifically, in adaptive gain control, for example, a resolution of 12 bits is used in a bright environment, and a resolution of 14 bits is used in a dim environment.

Further, in the dim environment, the following processing is performed. Specifically, brightness is determined at each pixel, amplification is performed on the basis of a difference in number of bits, A/D conversion is performed at a coarse resolution corresponding to 12 bits, and level adjustment (what is called gain deduction) is performed on the basis of the amplification amount after the A/D conversion, to perform compression into a resolution corresponding to 14 bits. Whether or not to perform gain deduction is determined by using a determination flag latched by the determination flag storage latch 146.

Figure 5:
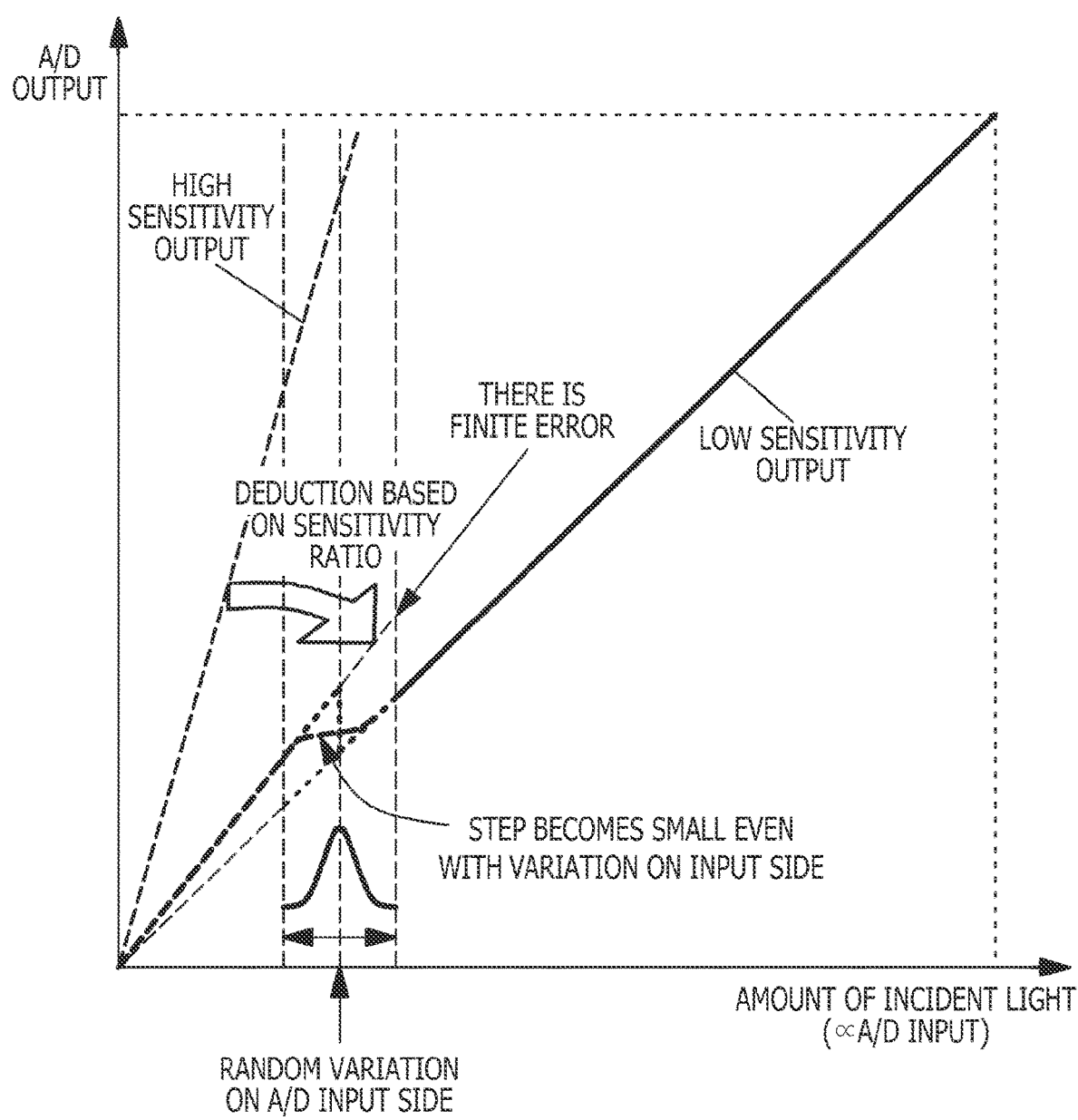
FIG. 5 is a characteristic diagram regarding an input light amount and an A/D output, which illustrates a manner in which a random offset threshold is set on the input side of an A/D converter.

As described above, in the signal processing unit for dynamic range expansion according to the present embodiment, as illustrated in FIG. 5, a sensitivity determination is made on the basis of the threshold adjusted by adding thereto a random offset that is randomly varied in an analog manner on the input side of the A/D converter 140, that is, before binary conversion. Specifically, in the present signal processing, by using an analog variation factor of each device, an offset (random offset) is added to the threshold on the basis of the normal distribution of the random variations, to adjust the threshold.

In such a manner, in the signal processing unit for dynamic range expansion according to the present embodiment, an offset is given to the determination threshold on the analog side on the basis of the normal distribution of analog random variations of the respective devices, and hence, the random offset does not have periodicity. Thus, as compared to the case of the technology using a threshold varied with a random number and a dither, the generation of a pseudo image can be prevented, and a high-quality image can thus be acquired.

Further, in a case where the signal processing unit according to the present embodiment is applied to an imaging element that includes, for example, the A/D converter 140 in each pixel column, there is no need to set values different among pixel columns as thresholds, unlike the case of the technology using a threshold varied with a random number and a dither. Accordingly, there is no need to provide, in each pixel column, a register or the like configured to hold a threshold. Thus, even when the number of pixel columns or the number of bits in A/D conversion increases, the circuit scale and power consumption can be prevented from increasing. In this regard, the same holds true for the case of being applied to an imaging element that includes the A/D converter 140 in each pixel.

Note that, in performing dynamic range expansion, the same object is imaged under multiple imaging conditions different from each other, to acquire multiple images with the different imaging conditions. Here, examples of the "imaging conditions" include an exposure, an exposure time, conversion efficiency, sensitivity (for example, pixel size difference), a gain, and the like. The gain is the analog gain of the A/D converter 140. The slope of the ramp waveform reference signal can be controlled to change the resolution, thereby setting different gains.

Figure 6:
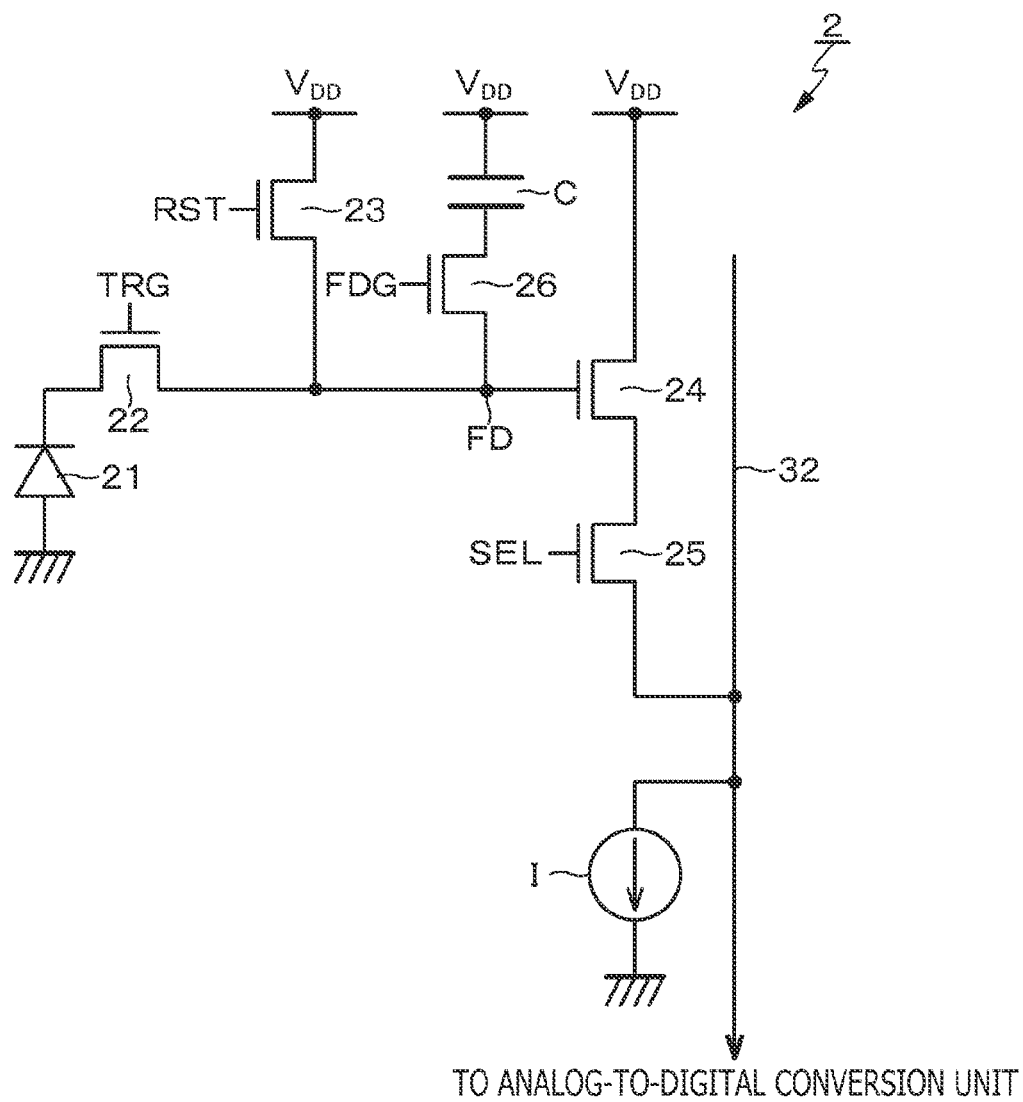
FIG. 6 is a circuit diagram illustrating an exemplary circuit configuration of a pixel having variable conversion efficiency.

The conversion efficiency is an efficiency with which a charge is converted to a voltage in the floating diffusion FD of the pixel 2 illustrated in FIG. 2, that is, a detection sensitivity that indicates a signal voltage per charge. The conversion efficiency is proportional to the reciprocal of the capacitance of the floating diffusion FD. Accordingly, as illustrated in FIG. 6, when a capacitive element C is connected to the floating diffusion FD of the pixel 2 via a conversion efficiency switching transistor 26, the conversion efficiency can be changed by controlling the conversion efficiency switching transistor 26 to be turned on or off on the basis of a conversion efficiency switching signal FDG. Specifically, when the conversion efficiency switching transistor 26 is turned on, the capacitance of the floating diffusion FD is increased, and the conversion efficiency can thus be switched from high conversion efficiency to low conversion efficiency.

Here, the basic operation of dynamic range expansion which is performed by changing conversion efficiency that is an exemplary imaging condition is described with reference to the timing waveform chart of FIG. 7.

Figure 7:
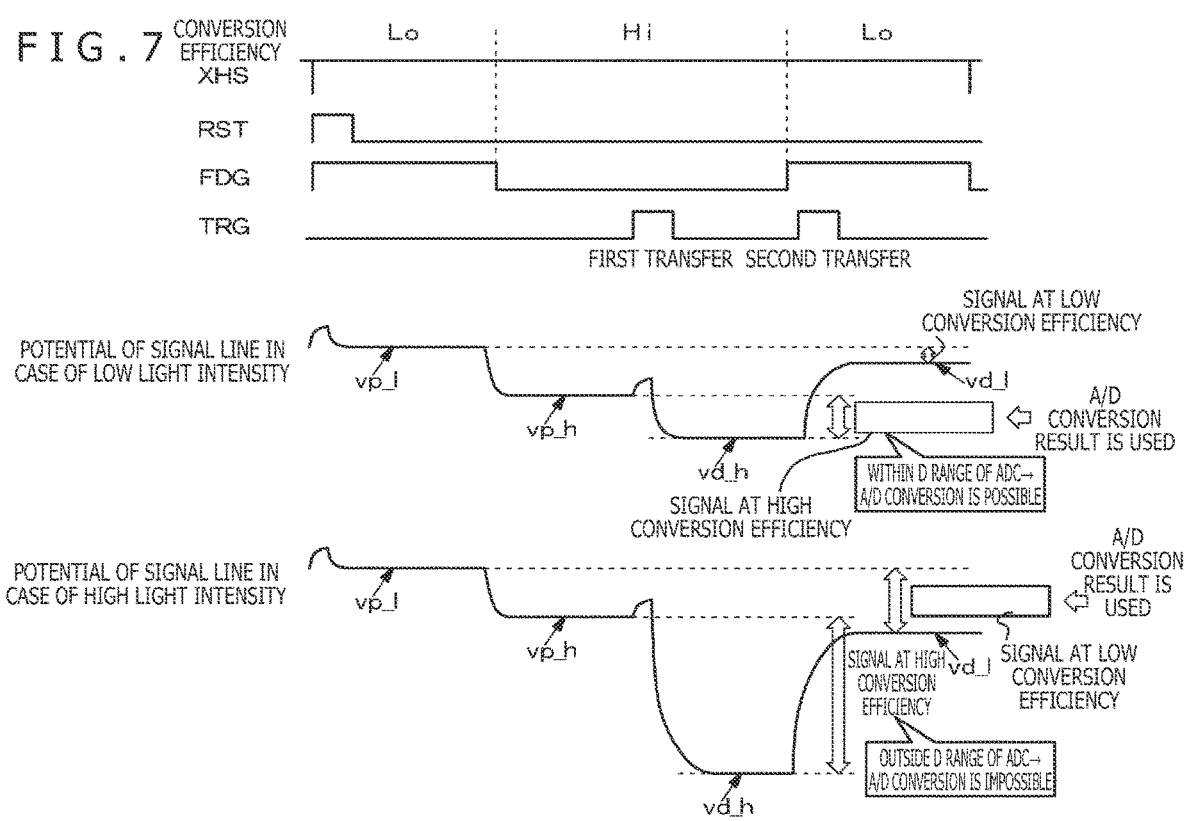
FIG. 7 is a timing waveform chart for explaining the basic operation of dynamic range expansion which is performed by changing conversion efficiency.

The timing waveform chart of FIG. 7 illustrates the timing relation between a horizontal synchronization signal XSH, the reset signal RST, the conversion efficiency switching signal FDG, and the transfer signal TRG, and also illustrates the signal potential of the signal line (vertical signal line 32)

in the case of low light intensity and the signal potential of the signal line in the case of high light intensity.

As described above, the pixel 2 outputs a reset signal (hereinafter referred to as a "P phase signal") at the reset level of the floating diffusion FD reset by the reset transistor 23 and a data signal (hereinafter referred to as a "D phase signal") at a signal level based on photoelectric conversion by the photodiode 21.

When the conversion efficiency switching signal FDG is at the high level, the conversion efficiency switching transistor 26 is on, and the conversion efficiency becomes low conversion efficiency (Lo). When the conversion efficiency switching signal FDG is at the low level, the conversion efficiency switching transistor 26 is off, and the conversion efficiency becomes high conversion efficiency (Hi).

When the reset signal RST changes to the high level and the reset transistor 23 resets the floating diffusion FD, a P phase signal vp_l is read from the pixel 2 in the low conversion efficiency period, and a P phase signal vp_h is read from the pixel 2 in the high conversion efficiency period. After the P phase signal vp_h is read, the transfer signal TRG changes to the high level in the high conversion efficiency period, and the first transfer from the photodiode 21 to the floating diffusion FD is performed. Then, a D phase signal vd_h is read.

Next, the low conversion efficiency period starts, and the transfer signal TRG changes to the high level. Then, the second transfer from the photodiode 21 to the floating diffusion FD is performed. High light intensity signals that have not been able to be received by the floating diffusion FD in the first transfer during the high conversion efficiency period and thus remain in the photodiode 21 are transferred from the photodiode 21 to the floating diffusion FD in the second transfer.

In the case of low light intensity, a signal corresponding to a difference between the P phase signal vp_h and the D phase signal vd_h in the high conversion efficiency period is within the dynamic range (D range) of the A/D converter 140 and can thus be subjected to A/D conversion. Accordingly, this signal is used as an A/D conversion result. In the case of high light intensity, a signal corresponding to a difference between the P phase signal vp_h and the D phase signal vd_h in the high conversion efficiency period is outside the dynamic range of the A/D converter 140 and can thus not be subjected to A/D conversion. Therefore, a signal corresponding to a difference between the P phase signal vp_l and a D phase signal vd_l in the low conversion efficiency period is used as an A/D conversion result.

Now, specific examples for performing the signal processing for dynamic range expansion according to the present embodiment are described.

First Example

A first example is an example in which one single-slope A/D converter images the same object at conversion efficiencies different from each other. In the first example, a case where an object is sequentially imaged by using a single pixel while the conversion efficiency is changed, to acquire multiple analog pixel signals is exemplified, but an object may also be simultaneously imaged by using multiple pixels having different conversion efficiencies, to acquire multiple analog pixel signals. In this regard, the same holds true for examples described later. Further, the same holds true for the case of the imaging conditions other than conversion efficiency, that is, the case of an exposure, an exposure time, sensitivity, or the like.

Figure 8:
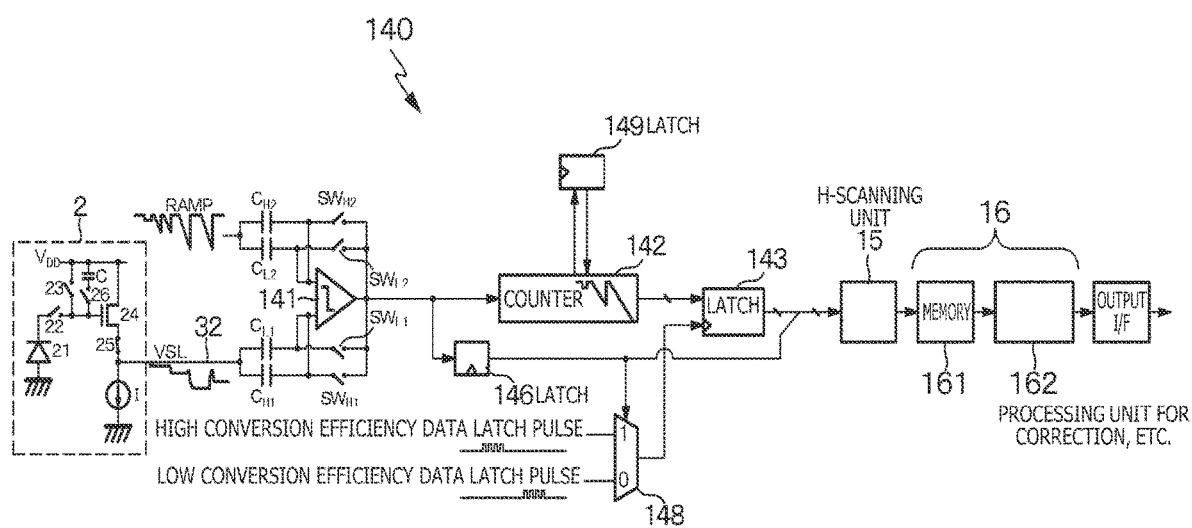
FIG. 8 is a block diagram illustrating an exemplary circuit configuration corresponding to a single pixel column of a signal processing system according to a first example.

FIG. 8 is a block diagram of an exemplary circuit configuration corresponding to a single pixel column of a signal processing system according to the first example. The A/D converter 140 is a single-slope A/D converter and has a pipeline reading configuration.

Figure 9:
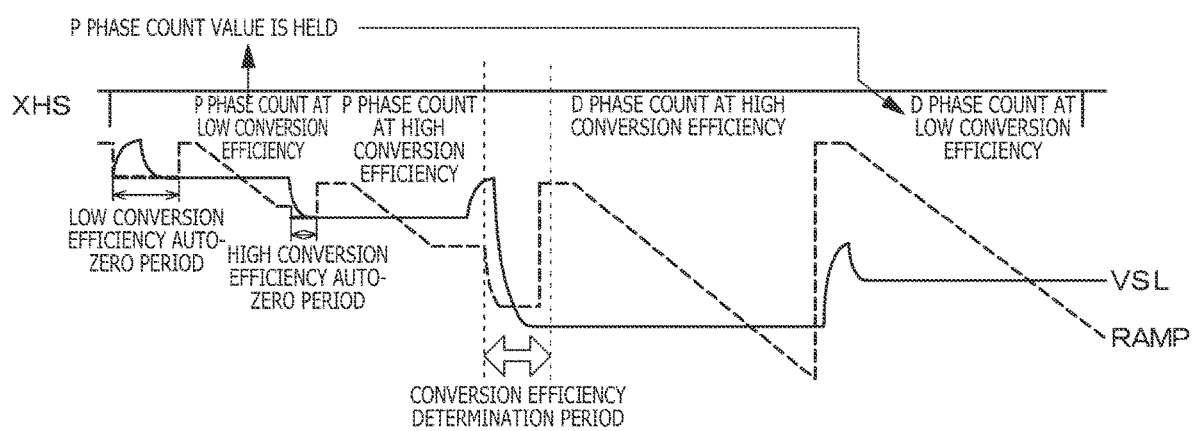
FIG. 9 is a timing waveform chart illustrating a timing relation for explaining the operation of the signal processing system according to the first example.

The single-slope A/D converter 140 receives a pixel signal from the pixel 2 through the vertical signal line 32, and receives a reference signal RAMP having a ramp waveform from the reference signal generation unit 19 (see FIG. 3). FIG. 9 is a timing waveform chart for explaining the operation of the signal processing system according to the first example. FIG. 9 illustrates the timing relation between the horizontal synchronization signal XHS, a signal potential VSL of the signal line (vertical signal line 32), and the reference signal RAMP.

As illustrated in FIG. 9, for example, a P phase signal at low conversion efficiency, a P phase signal at high conversion efficiency, a D phase signal at high conversion efficiency, and a D phase signal at low conversion efficiency are read in this order as pixel signals from the pixel 2 to the vertical signal line 32. Note that the order of signals exemplified herein is an example, and the order may be changed.

In the single-slope A/D converter 140, the comparator 141 has a conversion efficiency determination function (corresponding to the function of the comparison unit 145 in FIG. 4). Specifically, the comparator 141 includes, on the signal potential VSL side, a high conversion efficiency capacitive element $C_{H1}$ and an auto-zero switch $SW_{H1}$ that are connected to each other in series and a low conversion efficiency capacitive element $C_{L1}$ and an auto-zero switch $SW_{L1}$ that are connected to each other in series. The high conversion efficiency capacitive element $C_{H1}$ and the auto-zero switch $SW_{H1}$ are connected to the low conversion efficiency capacitive element $C_{L1}$ and the auto-zero switch $SW_{L1}$ in parallel.

The comparator 141 also includes, on the reference signal RAMP side, a high conversion efficiency capacitive element $C_{H2}$ and an auto-zero switch $SW_{H2}$ that are connected to each other in series and a low conversion efficiency capacitive element $C_{L2}$ and an auto-zero switch $SW_{L2}$ that are connected to each other in series. The high conversion efficiency capacitive element $C_{H2}$ and the auto-zero switch $SW_{H2}$ are connected to the low conversion efficiency capacitive element $C_{L2}$ and the auto-zero switch $SW_{L2}$ in parallel.

Here, the auto-zero switch $SW_{L1}$ and the auto-zero switch $SW_{L2}$ short-circuit the input and output terminals of the comparator 141 in the low conversion efficiency auto-zero period illustrated in FIG. 9, to reset the comparator 141. The auto-zero switch $SW_{H1}$ and the auto-zero switch $SW_{H2}$ short-circuit the input and output terminals of the comparator 141 in the high conversion efficiency auto-zero period illustrated in FIG. 9, to reset the comparator 141.

In the signal processing for dynamic range expansion according to the first example, in the comparator 141, a conversion efficiency determination is made in the conversion efficiency determination period illustrated in FIG. 9, that is, the first period of a D phase signal at high conversion efficiency. Since the comparator 141 has the conversion efficiency determination function, there is no need to separately provide a comparison unit for performing a conversion efficiency determination (corresponding to the comparison unit 145 in FIG. 4). To allow the comparator 141 to make a conversion efficiency determination, a randomly varied offset (random offset) needs to be superimposed on a conversion efficiency determination threshold (hereinafter sometimes simply referred to as a "determination threshold") that is the comparison threshold of the comparator 141. That is, the determination threshold needs to be adjusted.

(First Exemplary Technique of Adjusting Determination Threshold)

Here, as a first exemplary technique of adjusting a conversion efficiency determination threshold by superimposing a random offset on the determination threshold, a technique that controls the high conversion efficiency auto-zero period, which is illustrated in FIG. 9, to vary the determination threshold (determination standard level) for a D phase signal at high conversion efficiency is exemplified.

Figure 10:
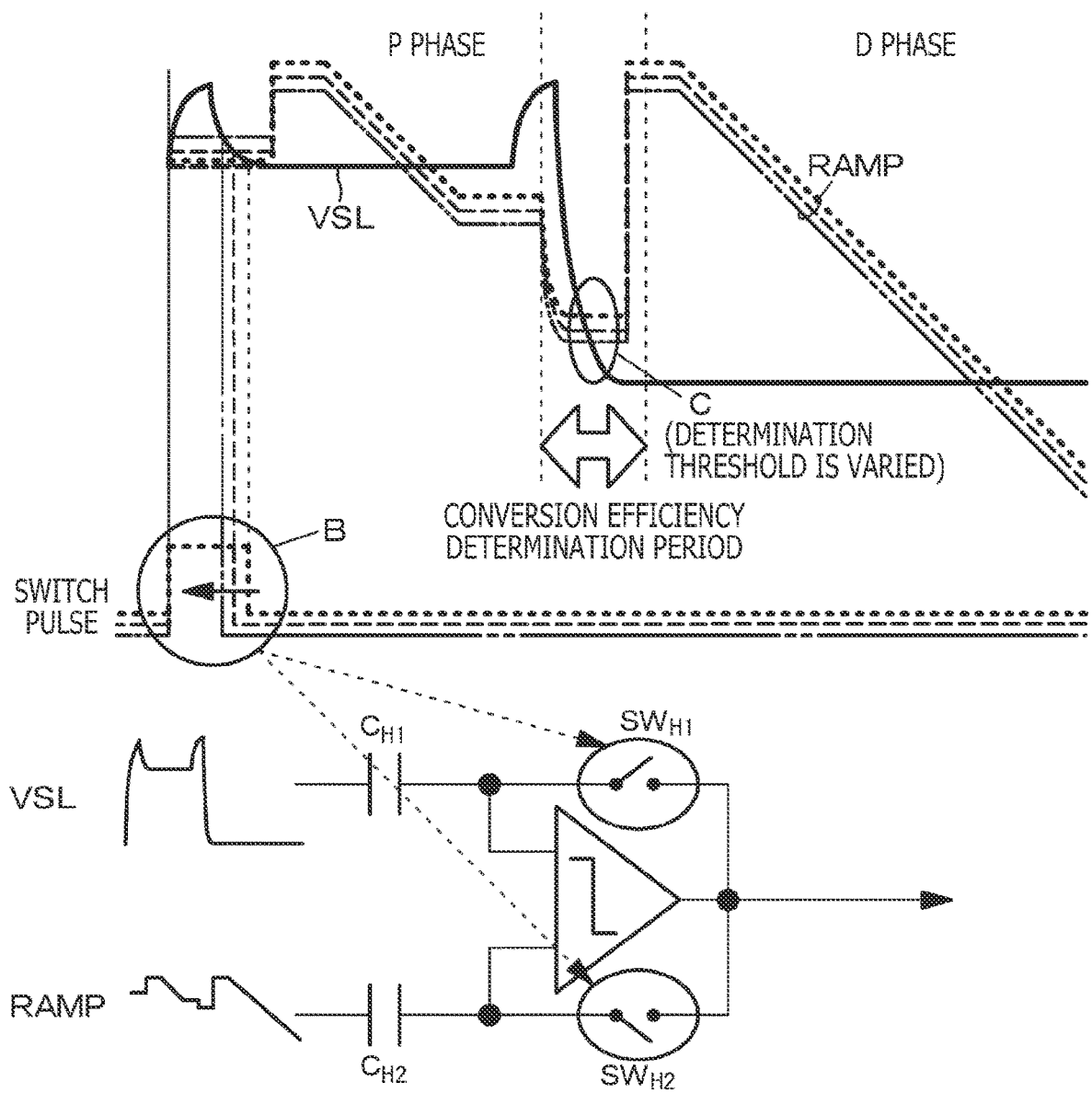
FIG. 10 is an explanatory diagram illustrating a first exemplary technique of adjusting a determination threshold.

Specifically, in FIG. 10, the pulse width of a switch pulse for driving the auto-zero switch $SW_{H1}$ and the auto-zero switch $SW_{H2}$ is narrowed as indicated by a solid circle B, to shorten the high conversion efficiency auto-zero period. As a result, settling is deteriorated. Since the counter 142 including the up/down counter has not executed CDS processing of taking a difference between a P phase and a D phase, the conversion efficiency determination threshold (determination standard level) for a D phase signal at high conversion efficiency can be varied, that is, a random offset can be superimposed on the conversion efficiency determination threshold, for each pixel column as indicated by a solid ellipse C.

In the case of the first example, the number of single-slope A/D converters 140 is one, and the number of counters 142 is also one. Further, the determination flag storage latch 146, a selector 148, and a holding latch 149 are provided around the counter 142. The determination flag storage latch 146 corresponds to the determination flag storage latch 146 illustrated in FIG. 4 and latches a conversion efficiency determination flag determined by the comparator 141. The conversion efficiency determination flag is a 1-bit flag. The flag has a logic "0" in a case where conversion efficiency determined by the comparator 141 is low conversion efficiency, and the flag has a logic "1" in a case where conversion efficiency determined by the comparator 141 is high conversion efficiency, for example.

The selector 148 receives two inputs of a high conversion efficiency data latch pulse and a low conversion efficiency data latch pulse. For example, the system control unit 17 illustrated in FIG. 1 generates the high conversion efficiency data latch pulse and the low conversion efficiency data latch pulse. The selector 148 selects and outputs either a high conversion efficiency data latch pulse or a low conversion efficiency data latch pulse on the basis of a conversion efficiency determination flag (I/O) latched by the determination flag storage latch 146.

Since the single counter 142 is used, a low conversion efficiency-side P phase count value needs to be temporarily held, and the holding latch 149 is accordingly provided. That is, the holding latch 149 latches a low conversion efficiency-side P phase count value which is acquired from the counter 142 to be temporarily held. Then, the holding latch 149 restores the low conversion efficiency-side P phase count value which has temporarily been held, to the counter 142 before low conversion efficiency-side D phase count.

The data latch 143, which is provided in a stage following the counter 142, latches the first CDS data at high conversion efficiency. Then, on the basis of a latch pulse (for high conversion efficiency data or low conversion efficiency data) selected by the selector 148, the data latch 143 does not latch low conversion efficiency data when high conversion efficiency is determined, and the data latch 143 overwrites the data with low conversion efficiency data when low conversion efficiency is determined. Here, the CDS data is data that has been subjected to CDS processing by the A/D converter 140.

The horizontal transfer scanning unit 15 receives either high conversion efficiency data or low conversion efficiency data which is output from the data latch 143 and a conversion efficiency determination flag (1 bit in the present example) latched by the determination flag storage latch 146. Either the high conversion efficiency data or the low conversion efficiency data and the conversion efficiency determination flag are eventually supplied to the signal processing unit 16 illustrated in FIG. 1.

Figure 11:
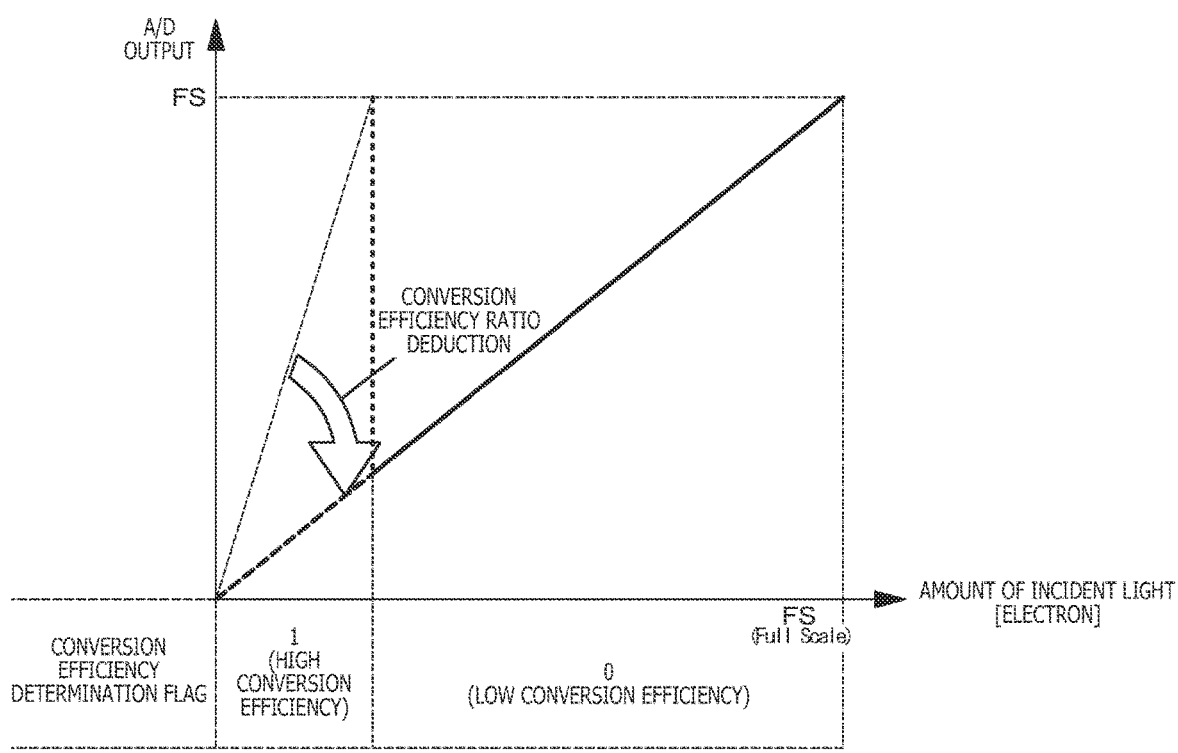
FIG. 11 is an explanatory diagram illustrating the deduction of a conversion efficiency ratio in the signal processing system according to the first example.

The signal processing unit 16 includes, for example, a memory 161 and a processing unit 162 that is configured to perform processing such as correction and sorting. As the memory 161, a line memory or a frame memory can be used. In the case where a frame memory is used, the effect of using only either high conversion efficiency data or low conversion efficiency data is large. The processing unit 162 performs, in addition to the processing such as correction and sorting, processing such as the deduction of a conversion efficiency ratio based on a conversion efficiency determination flag. FIG. 11 is a conceptual diagram of the deduction of a conversion efficiency ratio. In FIG. 11, the deduction processing is performed in the period in which the conversion efficiency determination flag has the logic "1," that is, the high conversion efficiency period. Data subjected to desired signal processing by the signal processing unit 16 is output from an output I/F 20 to the outside.

(Second Exemplary Technique of Adjusting Determination Threshold)

Figure 12A:
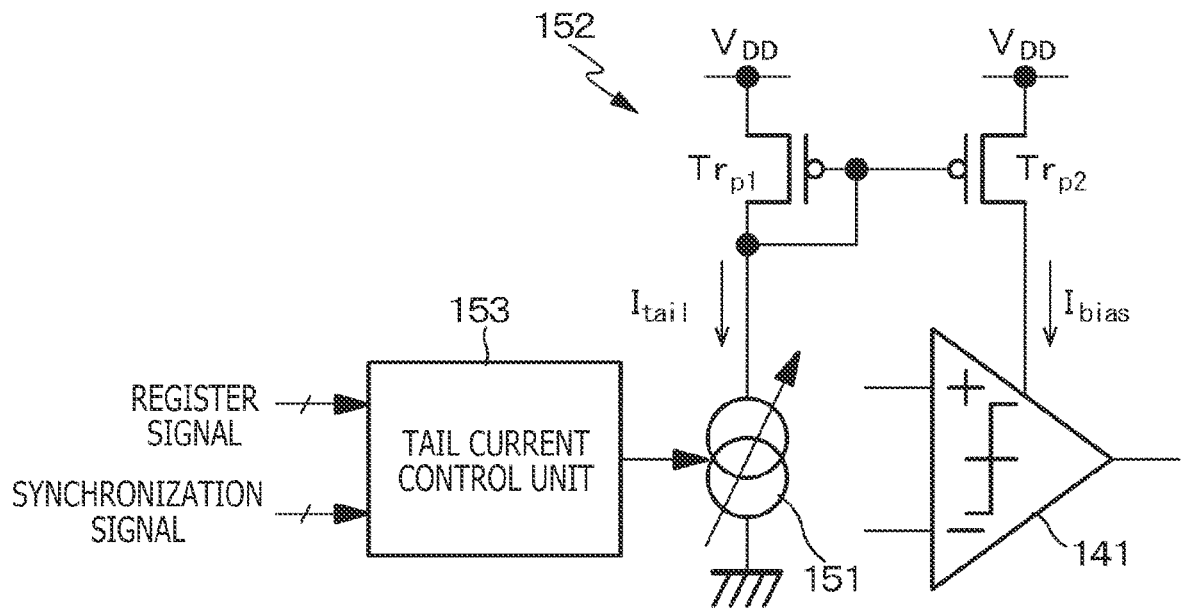
FIGS. 12A and 12B are explanatory diagrams illustrating a second exemplary technique of adjusting a determination threshold, and more specifically.

As illustrated in FIG. 12A, the comparator 141 of the A/D converter 140 receives a bias current $I_{bias}$ based on a tail current $I_{tail}$ flowing through a variable current source 151, via a current mirror circuit 152 including PMOS transistors $Tr_{p1}$ and $Tr_{p2}$. Here, as the amount of the bias current $I_{bias}$ that is supplied to the comparator 141 is reduced, the threshold of the comparator 141 is varied more largely.

Figure 13:
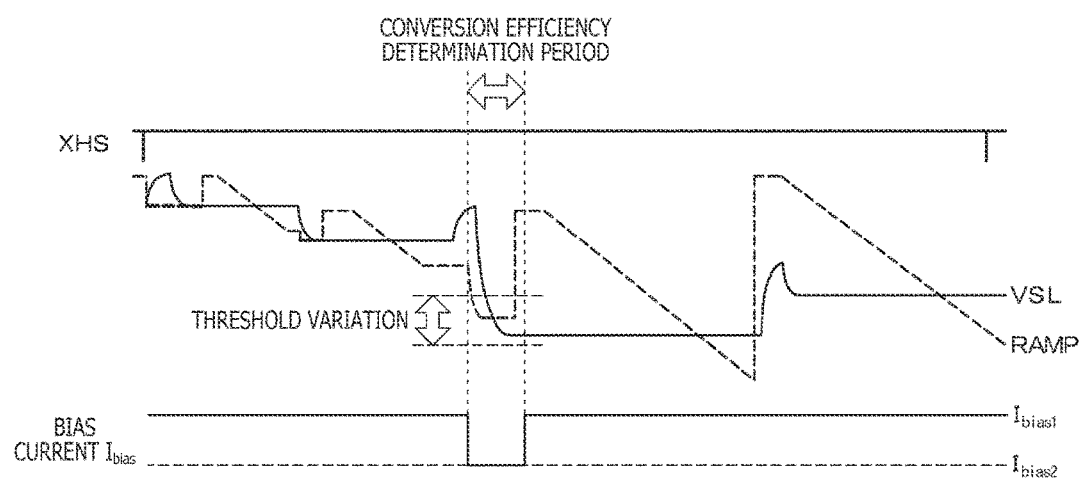
FIG. 13 is a timing waveform chart for explaining the operation of the second exemplary technique in which a random offset is superimposed on the determination threshold.

A second exemplary technique in which a random offset is superimposed on a conversion efficiency determination threshold is a technique of adjusting a determination threshold by utilizing the fact that, as the amount of the bias current $I_{bias}$ that is supplied to the comparator 141 is reduced, the threshold of the comparator 141 is varied more largely. Specifically, in the second example, as illustrated in FIG. 13, in the conversion efficiency determination period, the tail current $I_{tail}$ flowing through the variable current source 151 is controlled to control the bias current $I_{bias}$ in the comparator 141, to thereby vary the conversion efficiency determination threshold, that is, superimpose a random offset on the conversion efficiency determination threshold.

The tail current $I_{tail}$ flowing through the variable current source 151 is controlled under the control of a tail current control unit 153. In the conversion efficiency determination period, the tail current control unit 153 controls the tail current $I_{tail}$ on the basis of a register signal and a synchronization signal that are given from the outside, to change the bias current $I_{bias}$, which is to be supplied to the comparator 141, in such a manner that the bias current $I_{bias}$ becomes $I_{bias1}$, $I_{bias2}$ ($<I_{bias1}$) and then $I_{bias1}$. It is thus possible to vary the conversion efficiency determination threshold of the comparator 141.

Figure 12B:
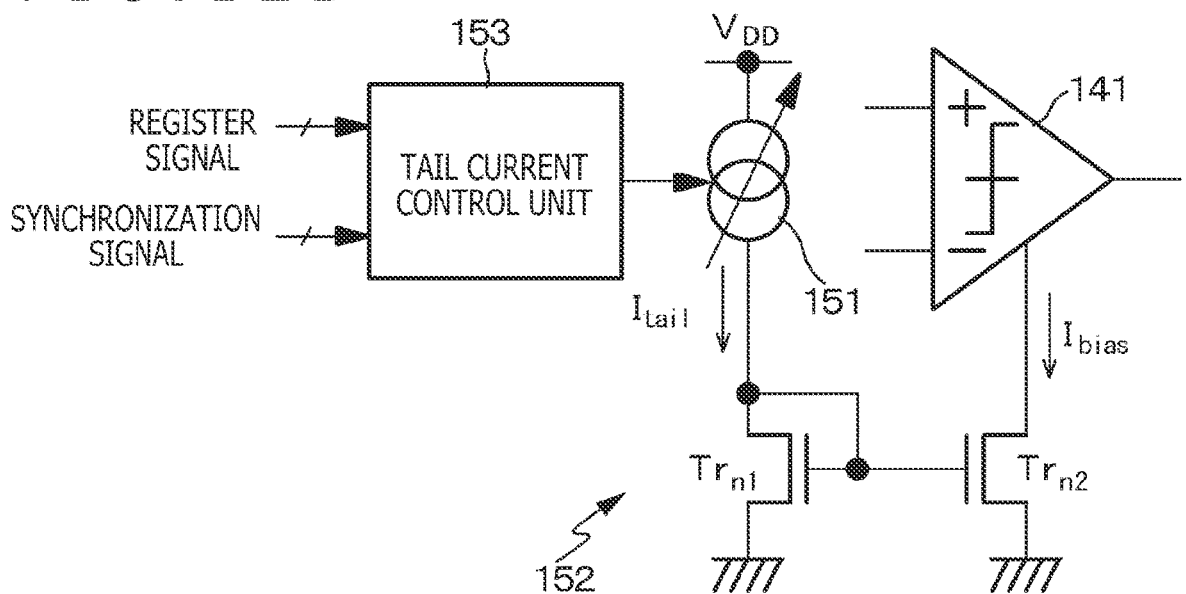

Here, the case where the current mirror circuit 152 includes the PMOS transistors $Tr_{p1}$ and $Tr_{p2}$ is exemplified. Also, in a case where the current mirror circuit 152 includes NMOS transistors $Tr_{n1}$ and $Tr_{n2}$ as illustrated in FIG. 12B, the conversion efficiency determination threshold of the comparator 141 can be varied by controlling the tail current $I_{tail}$.

(Third Exemplary Technique of Adjusting Determination Threshold)

Figure 14A:
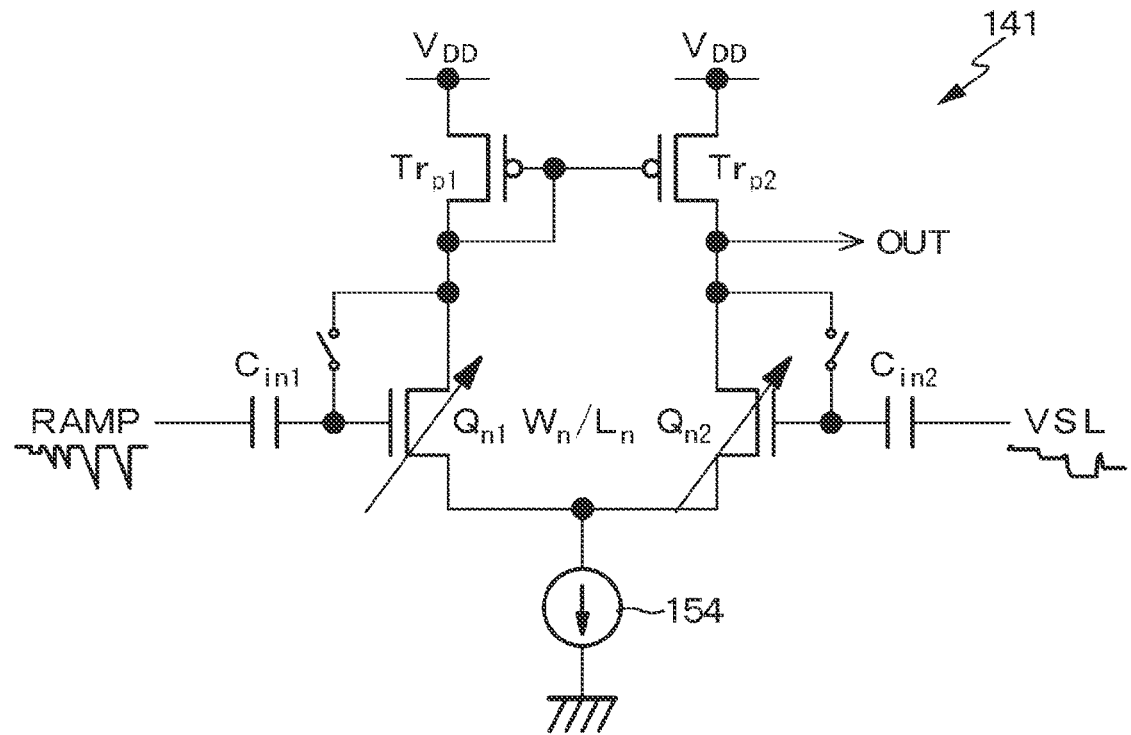
FIG. 14A is an explanatory diagram illustrating a third exemplary technique of adjusting a determination threshold.
Figure 14B:
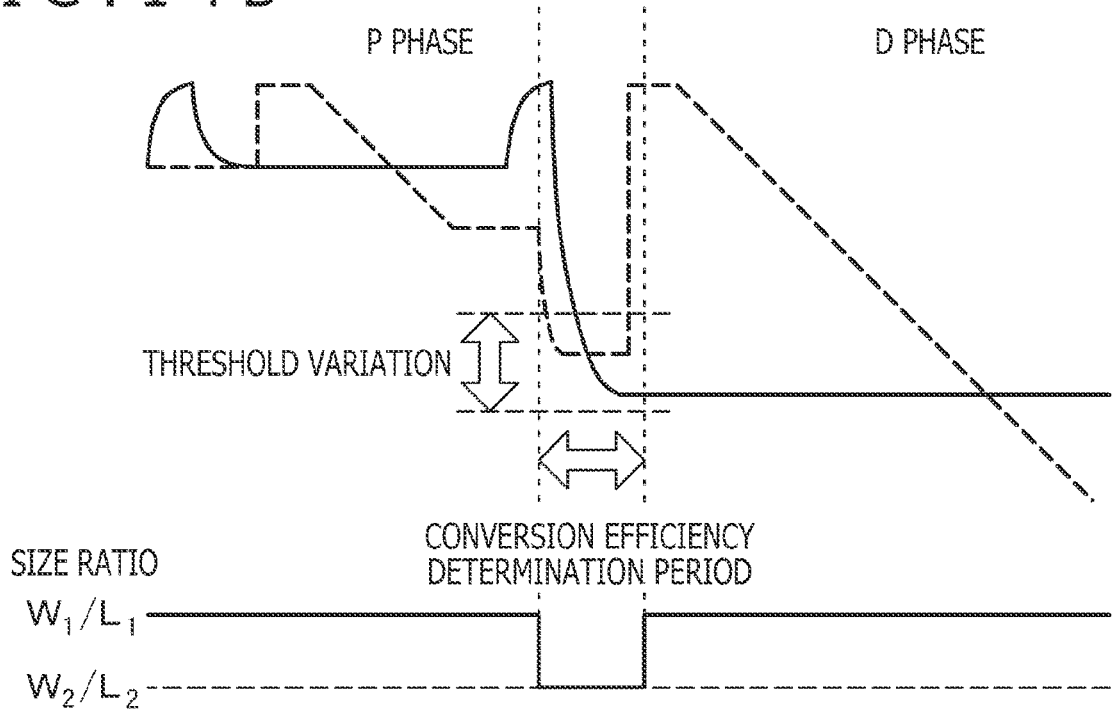
FIG. 14B is a timing waveform chart for explaining the operation of the third example.

A third exemplary technique of adjusting a conversion efficiency determination threshold by superimposing a random offset on the determination threshold is an example in which the size of differential pair transistors included in the comparator 141 is changed to vary the conversion efficiency determination threshold of the comparator 141. FIG. 14A is an explanatory diagram illustrating the third exemplary technique in which a random offset is superimposed on the determination threshold. FIG. 14B is a timing waveform chart for explaining the operation of the third example.

The comparator 141 has such a circuit configuration that includes, for example, NMOS differential pair transistors $Q_{n1}$ and $Q_{n2}$, the PMOS transistors $Tr_{p1}$ and $Tr_{p2}$ which form the current mirror circuit, and a constant current source 154. Further, the reference signal RAMP having a ramp waveform is input to a gate electrode of one of the differential pair transistors $Q_{n1}$ and $Q_{n2}$ via a capacitive element $C_{in2}$, and the signal potential VSL of the signal line (vertical signal line 32) is input to a gate electrode of the other one of the differential pair transistors $Q_{n1}$ and $Q_{n2}$ via a capacitive element $C_{in1}$.

In the comparator 141 having the configuration described above, a size ratio W/L (channel width/channel length) of the differential pair transistors $Q_{n1}$ and $Q_{n2}$ is changed in the conversion efficiency determination period in the third exemplary technique in which a random offset is superimposed on a conversion efficiency determination threshold. Specifically, as illustrated in FIG. 14B, in the conversion efficiency determination period, a size ratio $W_n/L_n$ of the differential pair transistors $Q_{n1}$ and $Q_{n2}$ is changed from $W_1/L_1$ to $W_2/L_2$ ($W_1/L_1 > W_2/L_2$), and the conversion efficiency determination threshold of the comparator 141 can thus be varied.

Second Example

Figure 15:
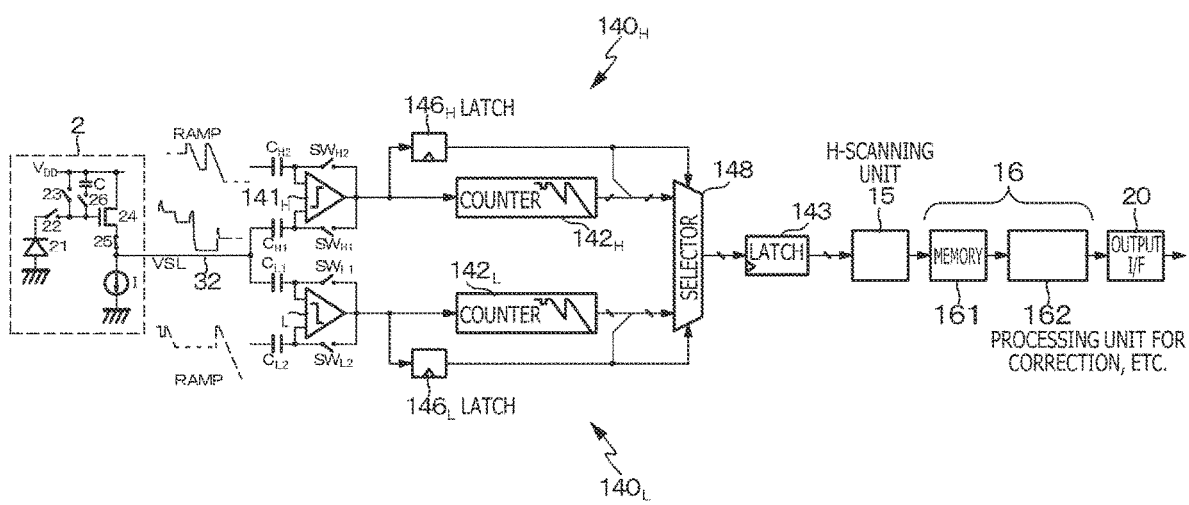
FIG. 15 is a block diagram illustrating an exemplary circuit configuration corresponding to a single pixel column of a signal processing system according to a second example.
Figure 16:
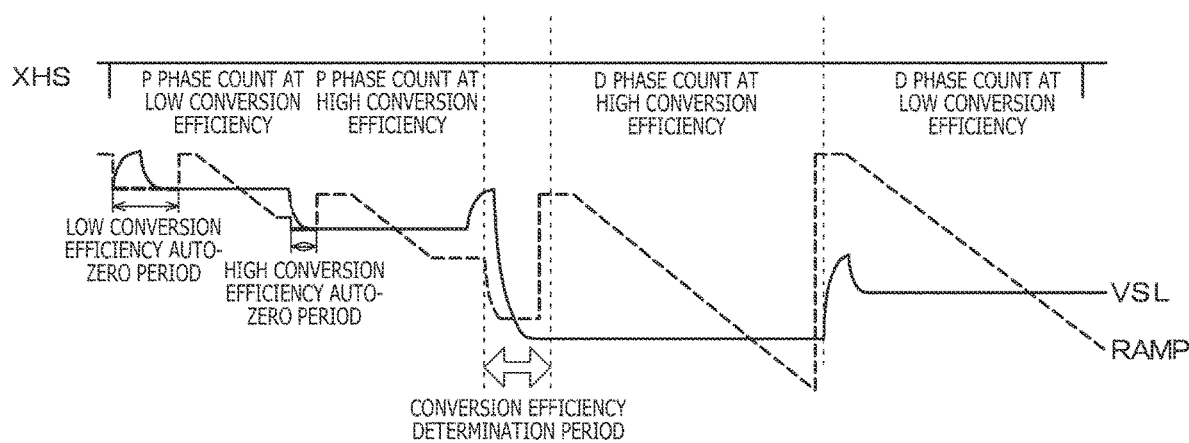
FIG. 16 is a timing waveform chart for explaining the operation of the signal processing system according to the second example.

A second example is a modified example of the first example and is an example in which two single-slope A/D converters (that is, comparators 141 and counters 142) are provided in parallel in each pixel column. FIG. 15 is a block diagram illustrating an exemplary circuit configuration corresponding to a single pixel column of a signal processing system according to the second example. FIG. 16 is a timing waveform chart for explaining the operation of the signal processing system according to the second example. FIG. 16 illustrates the timing relation between the horizontal synchronization signal XHS, the signal potential VSL of the signal line (vertical signal line 32), and the reference signal RAMP.

As illustrated in FIG. 15, in the second example, two A/D converters, that is, a single-slope A/D converter $140_H$ for high conversion efficiency and a single-slope A/D converter $140_L$ for low conversion efficiency, are provided. In the case of the second example, although the circuit scale is larger than that of the first example since the additional A/D converter is provided, actions and effects similar to those of the first example can be obtained.

Further, in the second example, since the single-slope A/D converter for high conversion efficiency and the single-slope A/D converter for low conversion efficiency are provided, there is an advantage that the need for the operation of temporarily holding a low conversion efficiency-side P phase count value, which is performed in the first example, is eliminated.

As a series of operations in the second example, as illustrated in the timing waveform chart of FIG. 16, the following operations are executed. Specifically, low conversion efficiency auto-zero, P phase count at low conversion efficiency, high conversion efficiency auto-zero, P phase count at high conversion efficiency, conversion efficiency determination, D phase count at high conversion efficiency, and D phase count at low conversion efficiency are performed in this order.

A comparator $141_H$ for high conversion efficiency or a comparator $141_L$ for low conversion efficiency determines conversion efficiency before counting a D phase signal. At this time, although a random offset needs to be superimposed on the determination threshold (conversion efficiency determination threshold) to adjust the determination threshold, the first, second, or third exemplary technique of adjusting a determination threshold, which is described in the first example, is also applicable to the case of the second example.

In a case where a conversion efficiency determination is made by the comparator $141_H$ for high conversion efficiency, a result of the determination is latched by a determination flag storage latch $146_H$ as a 1-bit determination flag. In a case where a conversion efficiency determination is made by the comparator $141_L$ for low conversion efficiency, a result of the determination is latched by a determination flag storage latch $146_L$ as a 1-bit determination flag. Then, the selector 148 selects CDS data at either high or low conversion efficiency on the basis of the determination flag latched by the determination flag storage latch $146_H$ or the determination flag storage latch $146_L$ and outputs the CDS data to the data latch 143 together with the determination flag. The operation of each of the units in stages following the data latch 143 is similar to that in the case of the first example.

Third Example

A third example is an example in which an adaptive attenuation single-slope A/D converter is used as an A/D converter. The A/D converter that is used in a signal processing system according to the third example is, for example, a 14-bit adaptive attenuation single-slope A/D converter.

Figure 17:
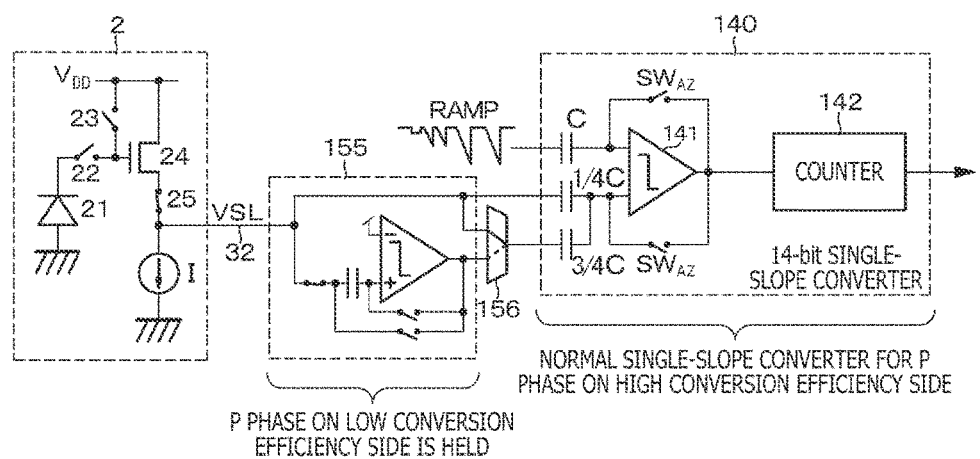
FIG. 17 is a circuit diagram illustrating the basic form of an adaptive attenuation single-slope analog-to-digital converter.

First, the basic form of the adaptive attenuation single-slope A/D converter that is used in the signal processing system according to the third example is described with reference to the circuit diagram of FIG. 17. Here, as an example, there is described an adaptive attenuation single-slope A/D converter in which, when the amplitude of an analog pixel signal output from the pixel 2, that is, the amplitude of the potential VSL of the signal line (vertical signal line 32), is relatively large, the amplitude is attenuated by a predetermined amount, for example, is attenuated to ¼ to compress the dynamic range, thereby achieving a reduction in voltage.

The A/D converter 140 of the adaptive attenuation single-slope type includes, on the input side of the comparator 141, a sample-and-hold circuit 155 configured to sample and hold a low conversion efficiency (low sensitivity)-side P phase signal. The reference signal RAMP having a ramp waveform is supplied to one of the inputs of the comparator 141 via a capacitive element having a capacitance value C (hereinafter referred to as "capacitance C").

The potential VSL of the signal line is supplied to the other input of the comparator 141 via a capacitive element having a capacitance value ¼C (hereinafter referred to as "capacitance ¼C"). The potential VSL of the signal line is also supplied to the other input of the comparator 141 via a capacitive element having a capacitance value ¾C (hereinafter referred to as "capacitance ¾C") through a switch 156 in a selective manner. A low conversion efficiency-side P phase signal held by the sample-and-hold circuit 155 is supplied to the other input of the comparator 141 via the capacitance ¾C through the switch 156 in a selective manner. An auto-zero switch $SW_{AZ}$ is connected between the input and output terminals of the comparator 141.

(Case where Level of D Phase Signal is Large)

Figure 18A:
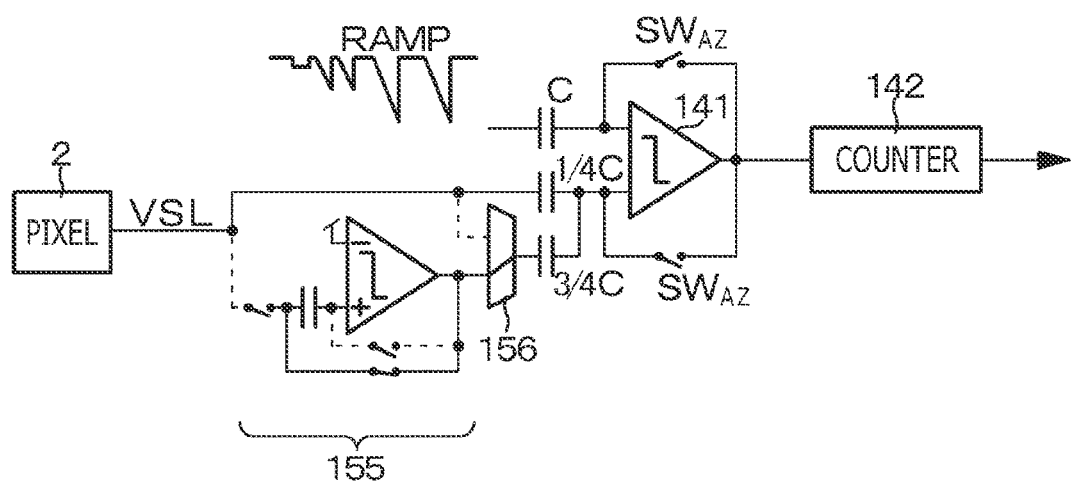
FIG. 18A is a circuit configuration diagram of the analog-to-digital converter when the level of a data signal is large.

FIG. 18A is a circuit configuration diagram of the A/D converter 140 when the level of a D phase signal is large. When the level of a D phase signal is relatively large, a low conversion efficiency-side P phase signal held by the sample-and-hold circuit 155 is selected by the switch 156 to be supplied to the other input of the comparator 141 via the capacitance ¾C, and the low conversion efficiency-side D phase signal is supplied to the other input of the comparator 141 via the capacitance ¼C. With this, the low conversion efficiency-side P phase signal and D phase signal are combined at a capacitance ratio of 3:1, and the D phase signal is thus attenuated to ¼.

Figure 18B:
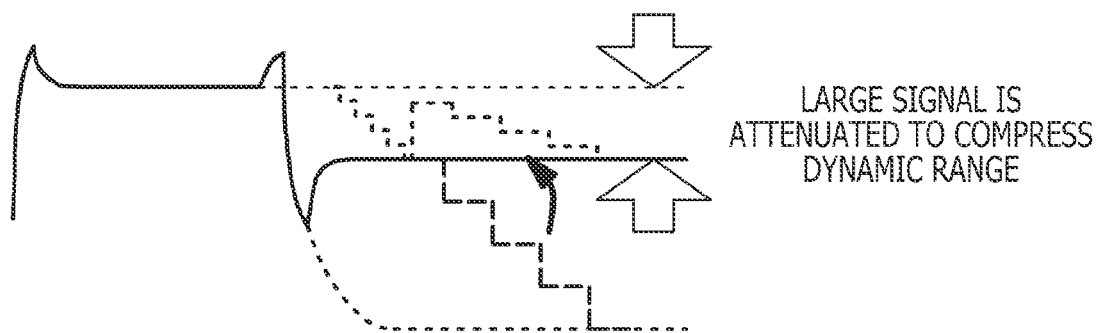
FIG. 18B is a waveform chart for explaining a dynamic range compression effect associated with adaptive attenuation.
Figure 19A:
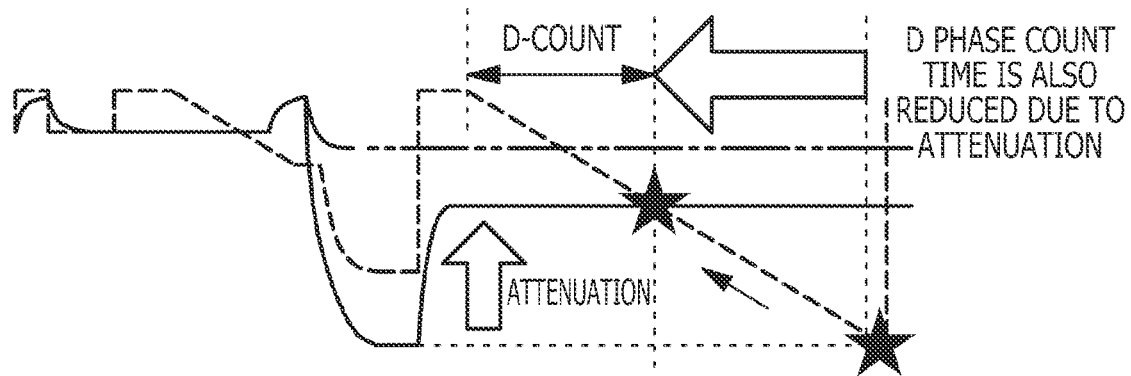
FIG. 19A is a waveform chart for explaining a D (data) phase count time reduction effect associated with adaptive attenuation.

In such a manner, a signal at a large level is attenuated, and the input dynamic range of the comparator 141 can thus be compressed as illustrated in FIG. 18B. Further, according to the compressed amount of the input dynamic range of the comparator 141, a reduction in voltage of the circuit power source of the comparator 141 can be achieved. Moreover, with the attenuation of the signal level, a reduction in D phase count time can also be achieved as illustrated in FIG. 19A.

(Case where Level of D Phase Signal is Small)

Figure 19B:
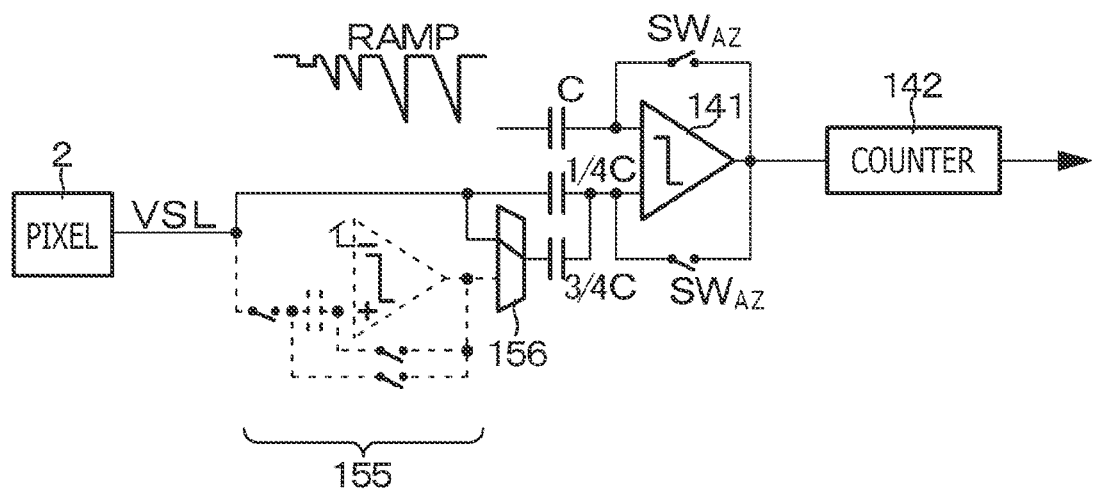
FIG. 19B is a circuit configuration diagram of the analog-to-digital converter when the level of a data signal is small.

FIG. 19B is a circuit configuration diagram of the A/D converter 140 when the level of a D phase signal is small. When the level of a D phase signal is relatively small, the D phase signal is supplied to the other input of the comparator 141 via the capacitance ¼C and is also supplied to the other input of the comparator 141 via the switch 156 and the capacitance ¾C, so that normal single-slope A/D conversion is performed.

Figure 20:
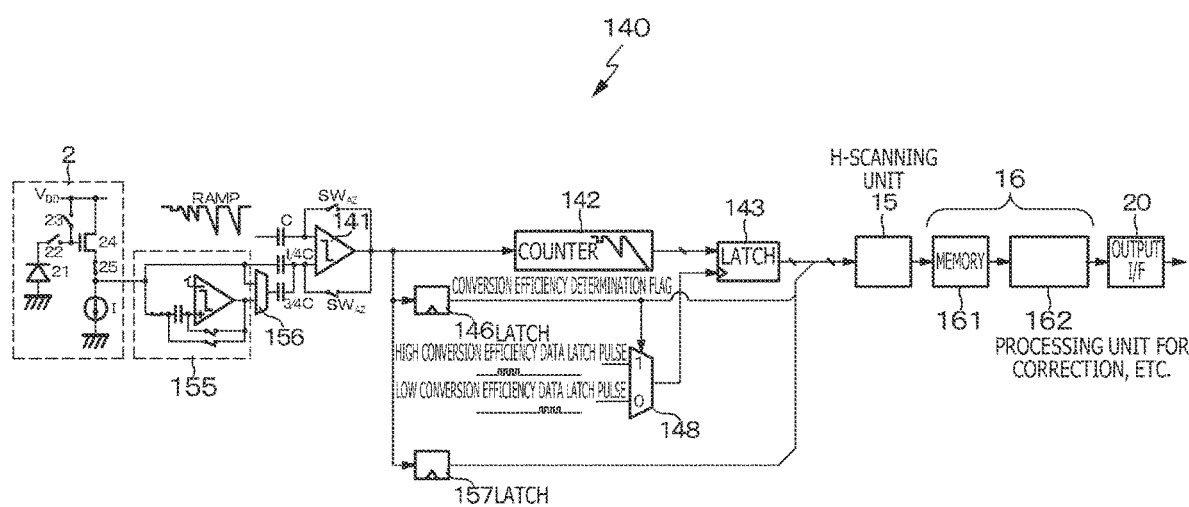
FIG. 20 is a block diagram illustrating an exemplary circuit configuration corresponding to a single pixel column of a signal processing system according to a third example.
Figure 21:
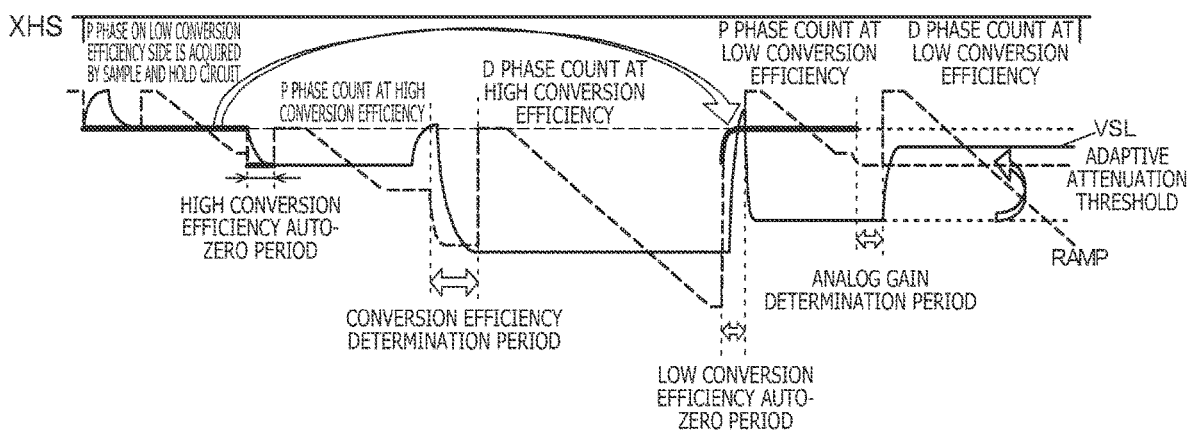
FIG. 21 is a timing waveform chart for explaining the operation of the signal processing system according to the third example.

The signal processing system according to the third example uses the A/D converter 140 of the adaptive attenuation single-slope type having the configuration described above. FIG. 20 is a block diagram illustrating an exemplary circuit configuration corresponding to a single pixel column of the signal processing system according to the third example. FIG. 21 is a timing waveform chart for explaining the operation of the signal processing system according to the third example. FIG. 21 illustrates the timing relation between the horizontal synchronization signal XHS, the signal potential VSL of the signal line (vertical signal line 32), and the reference signal RAMP.

In FIG. 20, the determination flag storage latch 146 latches a conversion efficiency determination flag determined by the comparator 141, such as a 1-bit flag having the logic "0" in a case of low conversion efficiency or the logic "1" in a case of high conversion efficiency, while the determination flag latch 157 latches an analog gain determination flag associated with adaptive attenuation by the comparator 141. The analog gain determination flag is a 1-bit flag having the logic "0" in a case of a low gain with attenuation or the logic "1" in a case of a high gain without attenuation, for example.

The conversion efficiency determination flag and the analog gain determination flag are supplied to the signal processing unit 16 via the horizontal transfer scanning unit 15 together with either high conversion efficiency data or low conversion efficiency data which is output from the data latch 143. In the signal processing unit 16, the processing unit 162 performs the deduction processing of a conversion efficiency ratio based on a conversion efficiency determination flag and the induction processing of a gain ratio based on an analog gain determination flag, as illustrated in FIG. 22.

Figure 22:
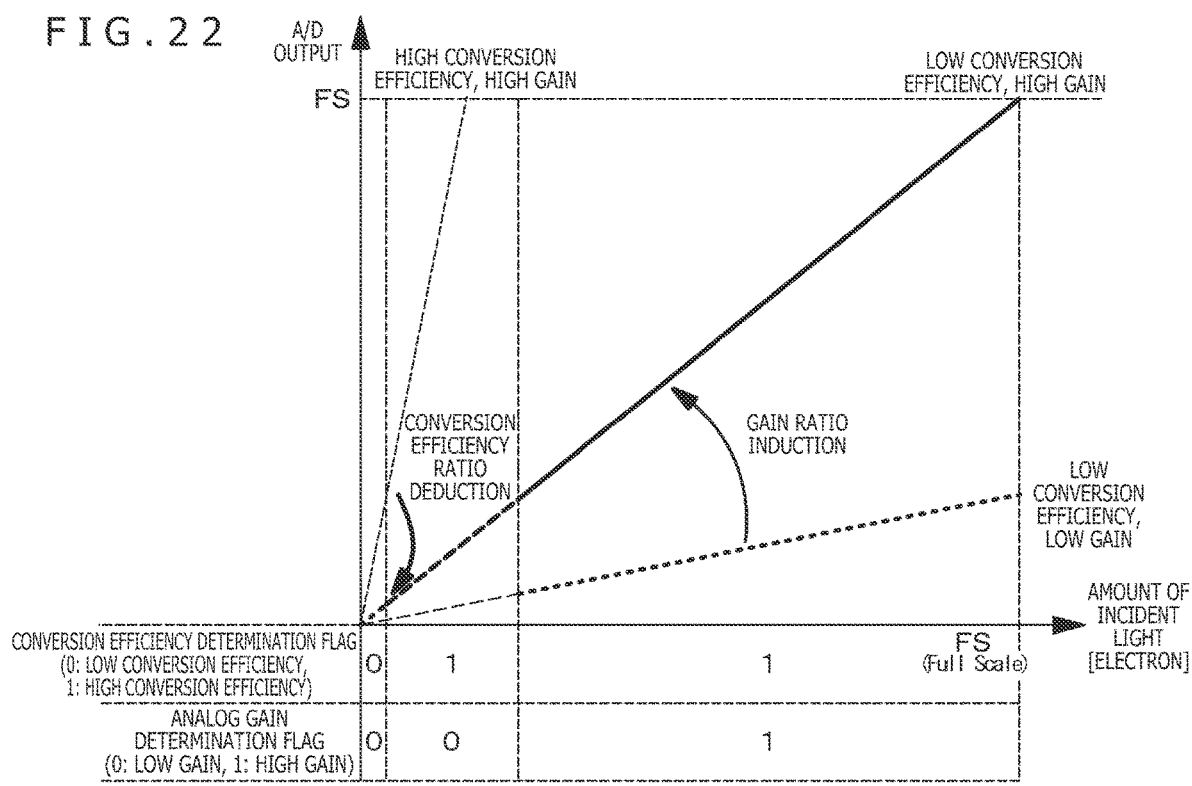
FIG. 22 is an explanatory diagram illustrating the deduction of a conversion efficiency ratio and the induction of an analog gain ratio in the signal processing system according to the third example.

Specifically, in FIG. 22, the deduction processing is performed in the period in which the conversion efficiency determination flag and the analog gain determination flag both have the logic "0," that is, the low conversion efficiency and low gain period. Further, the induction processing is performed in the period in which the conversion efficiency determination flag and the analog gain determination flag both have the logic "1," that is, the high conversion efficiency and high gain period.

A series of operations in the third example is as follows. That is, as illustrated in the timing waveform chart of FIG. 21, a low conversion efficiency-side P phase signal is first acquired by the sample-and-hold circuit 155, and high conversion efficiency auto-zero is then performed. At this time, the high conversion efficiency-side auto-zero period is shortened to vary the determination threshold for the D phase (conversion efficiency determination threshold). As the technique of varying a determination threshold, the first, second, or third exemplary technique of adjusting a determination threshold, which is described in the first example, can be employed.

After the high conversion efficiency-side auto-zero ends, P phase count at high conversion efficiency is performed, and then, conversion efficiency determination is made. With regard to the determination threshold for a conversion efficiency determination, since the high conversion efficiency-side auto-zero period is shortened, the determination threshold has been adjusted in a variable manner. After the conversion efficiency determination, the following operations are performed. Specifically, D phase count at high conversion efficiency, low conversion efficiency auto-zero, and P phase count at low conversion efficiency are performed in this order. The P phase count at low conversion efficiency is performed on the basis of a low conversion efficiency-side P phase signal acquired by the sample-and-hold circuit 155 in advance.

After the P phase count at low conversion efficiency ends, analog gain determination processing of determining whether or not to attenuate a D phase signal is performed on the basis of an analog gain determination flag latched by the determination flag latch 157, and the processing of D phase count at low conversion efficiency is then performed. In the above, the series of operations in the signal processing system according to the third example is described.

Although a random offset needs to be superimposed on the determination threshold (conversion efficiency determination threshold) to adjust the determination threshold, the first, second, or third exemplary technique of adjusting a determination threshold, which is described in the first example, is also applicable to the third example.

Fourth Example

A fourth example is an example in which one single-slope A/D converter images the same object with analog gains different from each other. In the fourth example, the case where the single A/D converter sequentially performs A/D conversion while changing the analog gain is exemplified, but multiple A/D converters having different analog gains may also simultaneously perform A/D conversion. The analog gains different from each other can be set by changing the slope of the ramp waveform of the reference signal RAMP.

Figure 23:
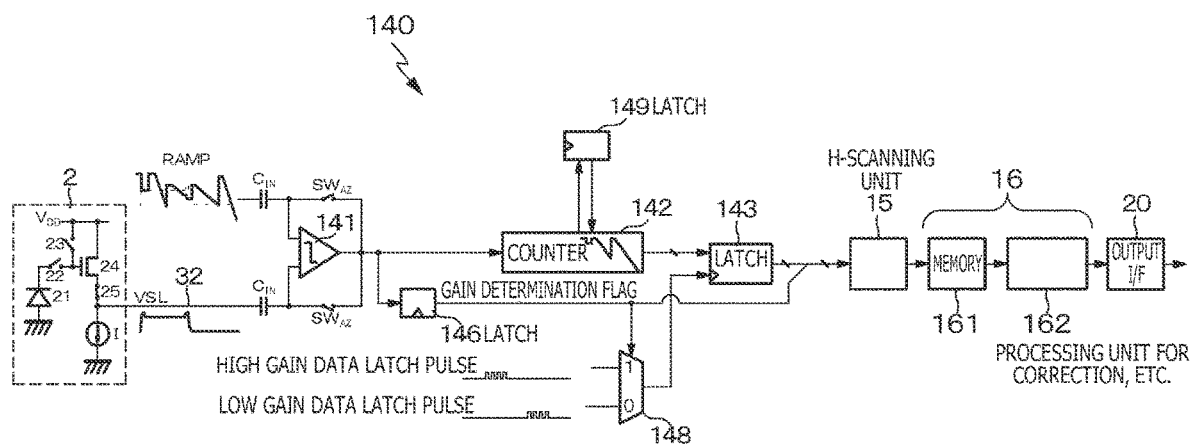
FIG. 23 is a block diagram illustrating an exemplary circuit configuration corresponding to a single pixel column of a signal processing system according to a fourth example.
Figure 24:
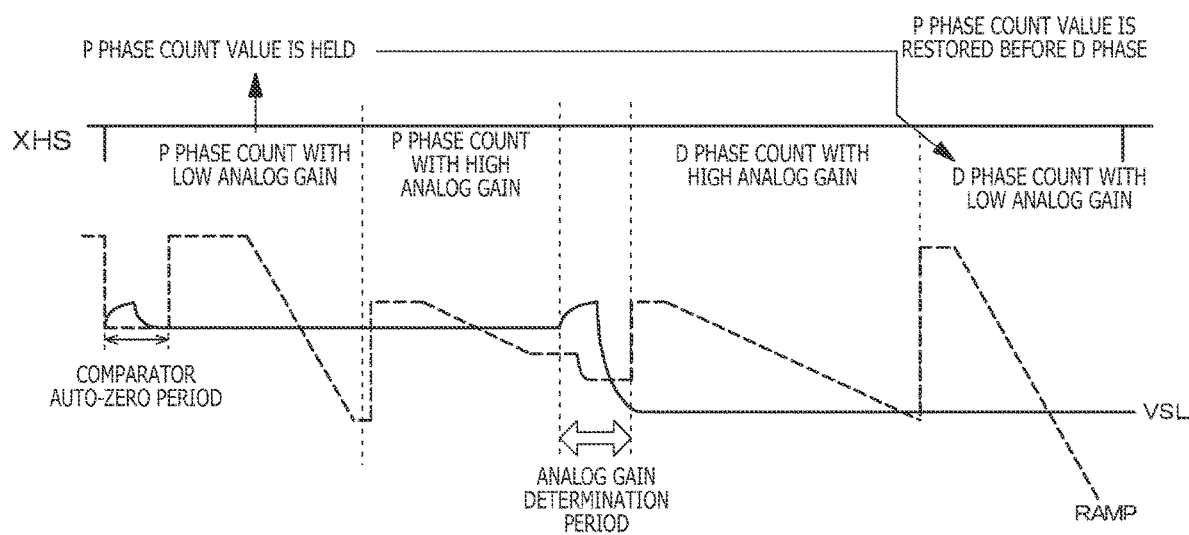
FIG. 24 is a timing waveform chart for explaining the operation of the signal processing system according to the fourth example.

FIG. 23 is a block diagram illustrating an exemplary circuit configuration corresponding to a single pixel column of a signal processing system according to the fourth example. FIG. 24 is a timing waveform chart for explaining the operation of the signal processing system according to the fourth example. FIG. 24 illustrates the timing relation between the horizontal synchronization signal XHS, the signal potential VSL of the signal line (vertical signal line 32), and the reference signal RAMP.

The components in stages following the counter 142 of the signal processing system according to the fourth example are basically the same as those in the case of the signal processing system according to the fourth example. The reference signals RAMP having ramp waveform slopes different from each other is supplied to one of the inputs of the comparator 141 via a capacitive element $C_{IN}$, and the signal potential VSL of the signal line (vertical signal line 32) is supplied to the other input of the comparator 141. The auto-zero switch $SW_{AZ}$ is connected between the input and output terminals of the comparator 141.

The determination flag storage latch 146 is a latch configured to store an analog gain determination flag regarding an analog gain that changes depending on the slope of the ramp waveform of the reference signal RAMP. The determination flag storage latch 146 latches a 1-bit analog gain determination flag having the logic "0" in a case of a low analog gain or the logic "1" in a case of a high analog gain.

The selector 148 receives two inputs of a high gain data latch pulse and a low gain data latch pulse. For example, the system control unit 17 illustrated in FIG. 1 generates the high gain data latch pulse and the low gain data latch pulse. The selector 148 selects and outputs either a high gain data latch pulse or a low gain data latch pulse on the basis of an analog gain determination flag (1/0) latched by the determination flag storage latch 146.

Since the single counter 142 is used, the holding latch 149 for temporarily holding a low conversion efficiency-side P phase count value is provided. That is, the holding latch 149 latches a low gain-side P phase count value which is acquired from the counter 142 to be temporarily held. Then, the holding latch 149 restores the low conversion efficiency-side P phase count value which has temporarily been held, to the counter 142 before low gain-side D phase count.

Figure 25:
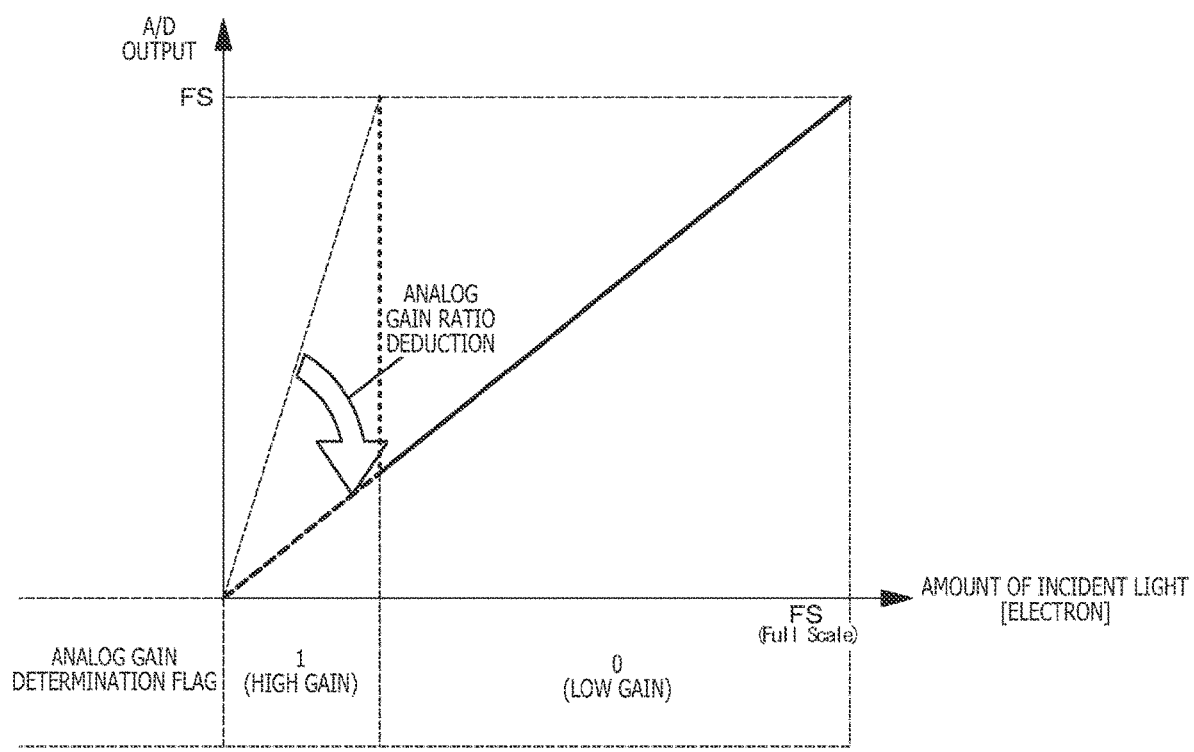
FIG. 25 is an explanatory diagram illustrating the deduction of an analog gain ratio in the signal processing system according to the fourth example.

An analog gain determination flag latched by the determination flag storage latch 146 is supplied to the signal processing unit 16 via the horizontal transfer scanning unit 15 together with either high conversion efficiency data or low conversion efficiency data which is output from the data latch 143. In the signal processing unit 16, the processing unit 162 performs the deduction processing of an analog gain ratio on the basis of an analog gain determination flag, as illustrated in FIG. 25. Specifically, in FIG. 25, the deduction processing of an analog gain ratio is performed in the period in which the analog gain determination flag has the logic "1," that is, the high gain period.

As a series of operations in the fourth example, as illustrated in the timing waveform chart of FIG. 24, after auto-zero of the comparator 141, the following operations are executed. Specifically, P phase count with a low analog gain, holding of P phase count value, P phase count with a high analog gain, analog gain determination, D phase count with a high analog gain, and D phase count with a low analog gain are performed in this order. Further, before the D phase count with a low analog gain, the held P phase count value with a low analog gain is restored, and the operation of D phase count with a low analog gain is then executed.

As the technique of varying an analog gain determination threshold, the first, second, or third exemplary technique of adjusting a determination threshold, which is described in the first example, is also applicable to the case of the fourth example.

Fifth Example

A fifth example is a modified example of the fourth example and is an example in which two single-slope analog-to-digital converters (that is, comparators 141 and counters 142) are provided in parallel.

Figure 26:
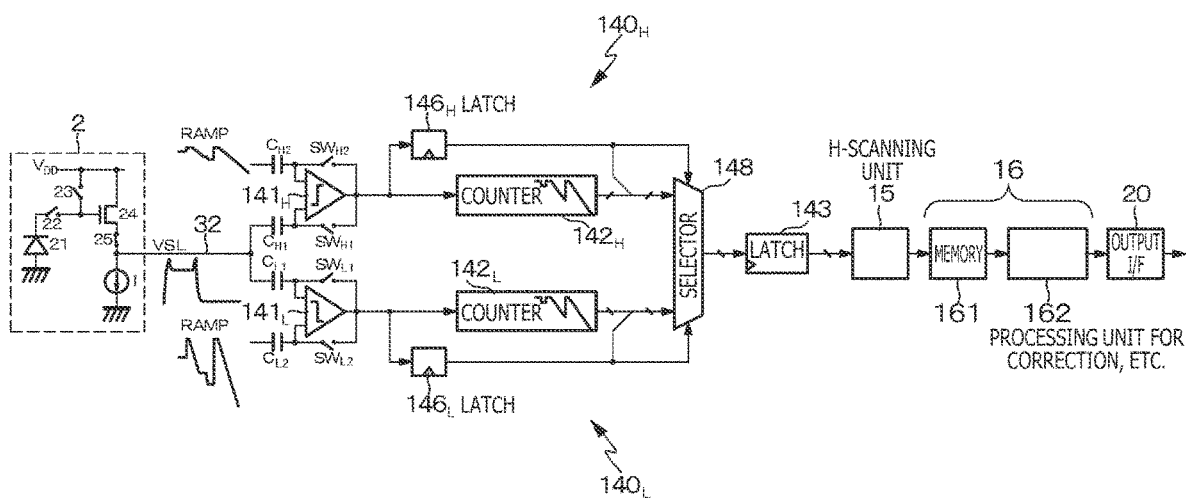
FIG. 26 is a block diagram illustrating an exemplary circuit configuration corresponding to a single pixel column of a signal processing system according to a fifth example.
Figure 27:
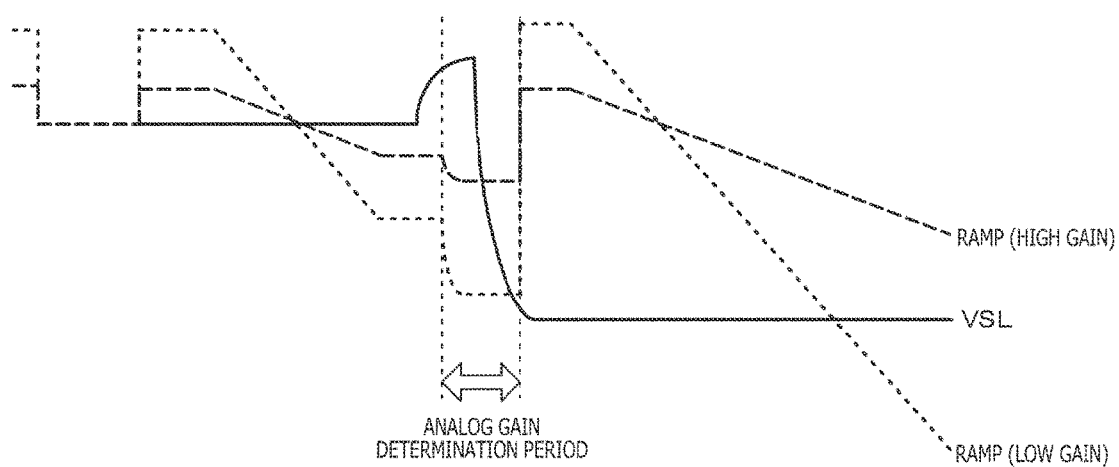
FIG. 27 is a timing waveform chart for explaining the operation of the signal processing system according to the fifth example.

FIG. 26 is a block diagram illustrating an exemplary circuit configuration corresponding to a single pixel column of a signal processing system according to the fifth example. FIG. 27 is a timing waveform chart for explaining the operation of the signal processing system according to the fifth example. FIG. 27 illustrates the timing relation between the horizontal synchronization signal XHS and the signal potential VSL of the signal line (vertical signal line 32). FIG. 27 further illustrates the timing relation between the high analog gain reference signal RAMP (dashed line) and the low analog gain reference signal RAMP (dotted line).

As illustrated in FIG. 26, in the fifth example, two A/D converters, that is, the single-slope A/D converter $140_H$ for a high analog gain and the single-slope A/D converter $140_L$ for a low analog gain, are provided. In the case of the fifth example, although the circuit scale is larger than that of the fourth example since the additional A/D converter is provided, actions and effects similar to those of the fourth example can be obtained.

Further, in the fifth example, since the single-slope A/D converter for a high analog gain and the single-slope A/D converter for a low analog gain are provided, there is an advantage that the need for the operation of temporarily holding a low analog gain-side P phase count value, which is performed in the fourth example, is eliminated.

The comparator $141_H$ for a high analog gain or the comparator $141_L$ for a low analog gain determines an analog gain before counting a D phase signal. At this time, although a random offset needs to be superimposed on the determination threshold (analog gain determination threshold) to adjust the determination threshold, the first, second, or third exemplary technique of adjusting a determination threshold, which is described in the first example, is also applicable to the case of the fifth example.

Sixth Example

A sixth example is a modified example of the second example and is an example in which the conversion efficiency determination threshold is varied by using the variation of the potentials of the P phase signal and D phase signal of each pixel. The technology according to the sixth example is similarly applicable to imaging conditions other than conversion efficiency, such as a difference in accumulation time (long/short) and a difference in pixel size (large/small).

Figure 28:
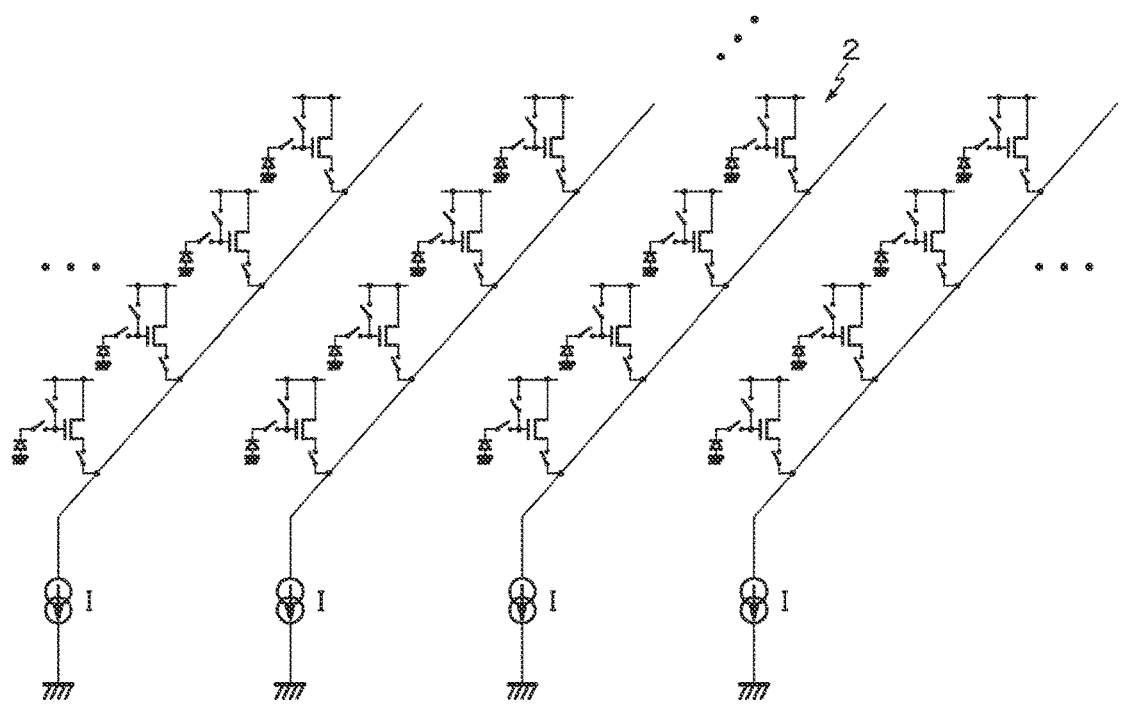
FIG. 28 is a schematic diagram schematically illustrating the two-dimensional array of pixels.
Figure 29:
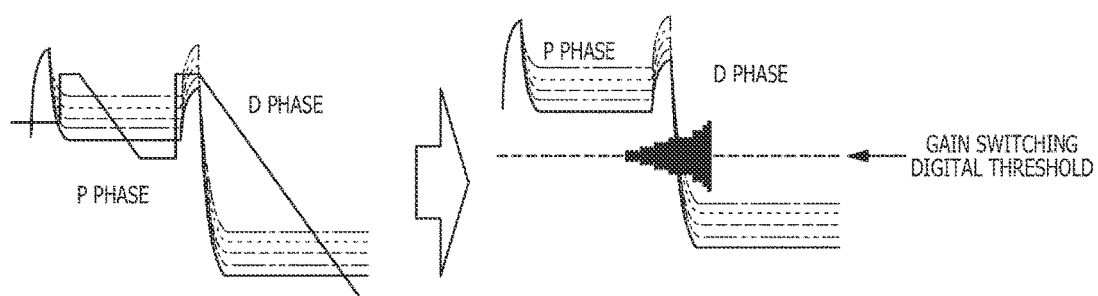
FIG. 29 is a waveform chart illustrating a manner in which a reset signal and a data signal of each pixel have randomly varied potentials.

In the two-dimensional array of the pixels 2 which is schematically illustrated in the schematic diagram of FIG. 28, the potentials of the P phase signal and D phase signal of each pixel are randomly varied by the amplification transistor 24 (see FIG. 2) of the pixel 2 or the like, as illustrated in FIG. 29. Thus, even in a case of the same incident light amount, the potential in the D phase alone and D phase digital data that has been subjected to digital conversion are randomly varied. By utilizing this, D phase digital data is compared with a fixed digital threshold, and actions and effects similar to those in the case where the conversion efficiency determination threshold is varied can also be achieved. That is, by performing a digital comparison between the D phase alone alone and the fixed digital threshold, the switching code can randomly be varied naturally.

Figure 30:
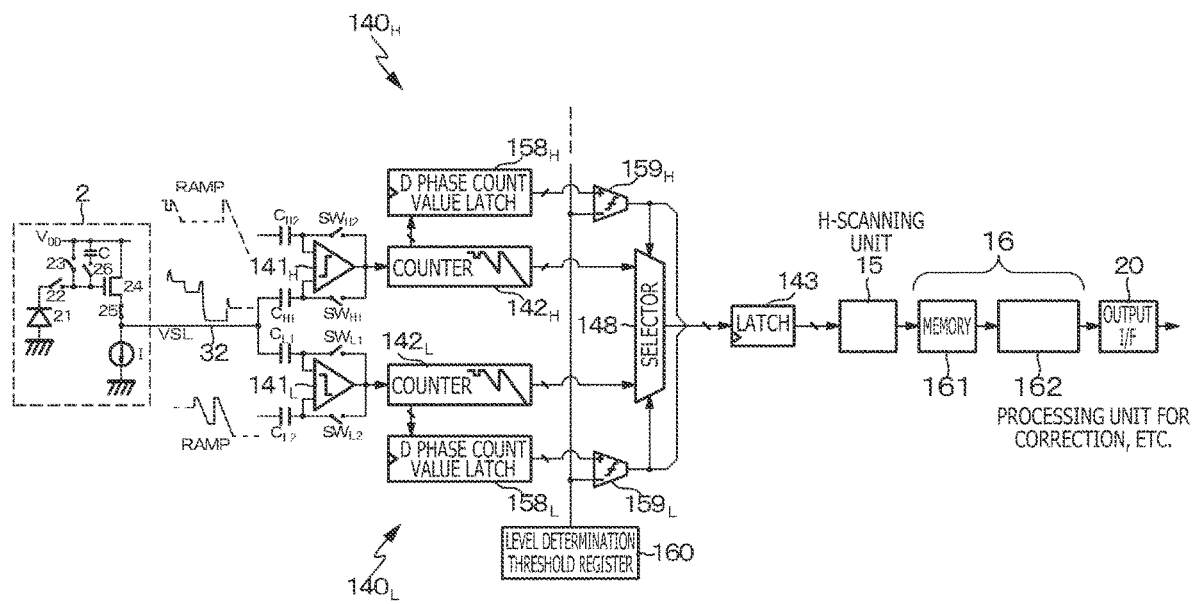
FIG. 30 is a block diagram illustrating an exemplary circuit configuration corresponding to a single pixel column of a signal processing system according to a sixth example.
Figure 31:
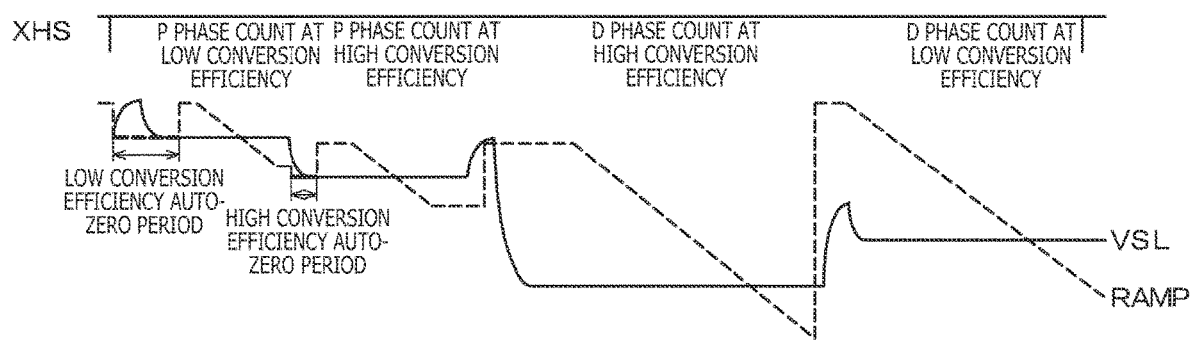
FIG. 31 is a timing waveform chart for explaining the operation of the signal processing system according to the sixth example.

FIG. 30 is a block diagram illustrating an exemplary circuit configuration corresponding to a single pixel column of a signal processing system according to the sixth example. FIG. 31 is a timing waveform chart for explaining the operation of the signal processing system according to the sixth example. FIG. 31 illustrates the timing relation between the horizontal synchronization signal XHS, the signal potential VSL of the signal line (vertical signal line 32), and the reference signal RAMP.

The single-slope A/D converter $140_H$ for high conversion efficiency includes a D phase count value latch $158_H$ and a comparison unit 159H for determining the level of the output of the latch $158_H$, and the single-slope A/D converter $140_L$ for low conversion efficiency includes a D phase count value latch $158_L$ and a comparison unit $159_L$ for determining the level of the output of the latch $158_L$. The comparison unit 159H and the comparison unit $159_L$ receive, as a level determination threshold, a fixed digital threshold which is uniform in every pixel column from a register 160.

On the basis of either a high conversion efficiency determination flag or a low conversion efficiency determination flag which is output from the comparison unit 159H or the comparison unit $159_L$, the selector 148 selects the output of the counter at high conversion efficiency or low conversion efficiency, and supplies the output to the latch 143 together with the conversion efficiency determination flag. The operation of each of the units in stages following the latch 143 is similar to that in the case of the first example.

As a series of operations in the sixth example, as illustrated in the timing waveform chart of FIG. 31, the following operations are executed. Specifically, low conversion efficiency auto-zero, P phase count at low conversion efficiency, high conversion efficiency auto-zero, P phase count at high conversion efficiency, D phase count at high conversion efficiency, and D phase count at low conversion efficiency are performed in this order.

Seventh Example

A seventh example is a modified example of the sixth example and is an example in which the same object is imaged with analog gains different from each other.

Figure 32:
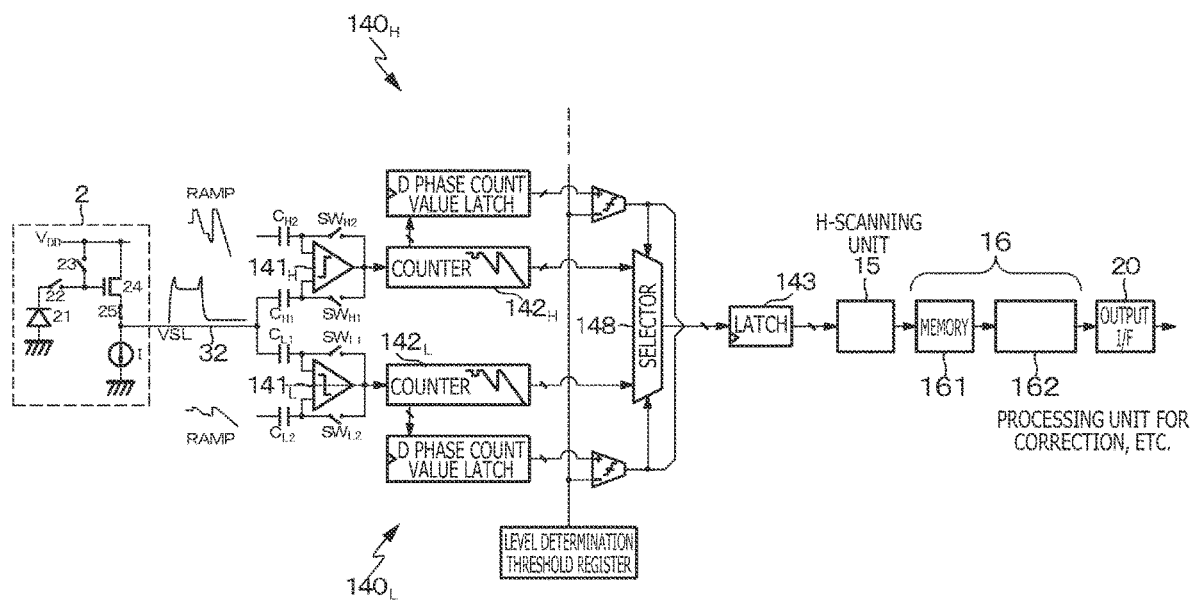
FIG. 32 is a block diagram illustrating an exemplary circuit configuration corresponding to a single pixel column of a signal processing system according to a seventh example.
Figure 33:
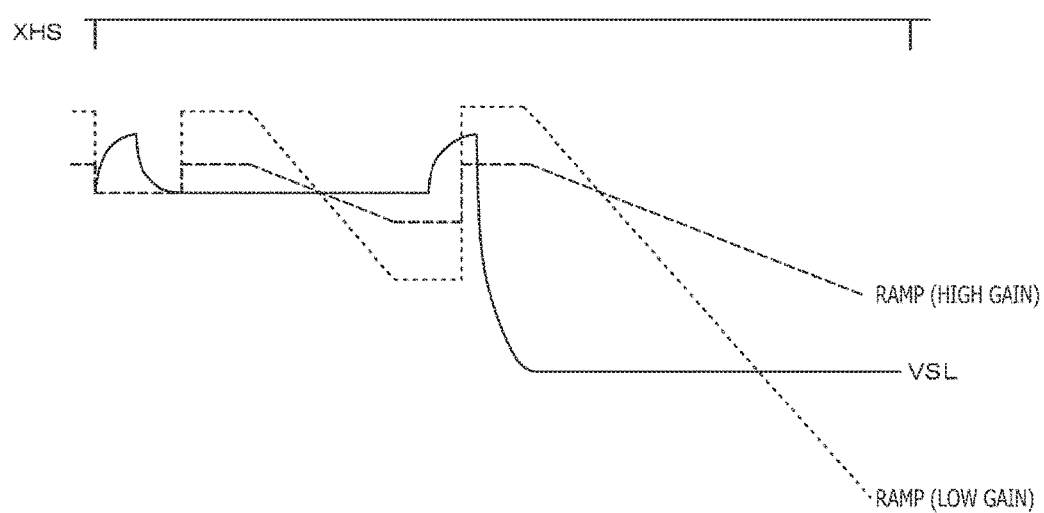
FIG. 33 is a timing waveform chart for explaining the operation of the signal processing system according to the seventh example.

FIG. 32 is a block diagram illustrating an exemplary circuit configuration corresponding to a single pixel column of a signal processing system according to the seventh example. FIG. 33 is a timing waveform chart for explaining the operation of the signal processing system according to the seventh example. FIG. 33 illustrates the timing relation between the horizontal synchronization signal XHS and the signal potential VSL of the signal line (vertical signal line 32). FIG. 33 further illustrates the timing relation between the high analog gain reference signal RAMP (dashed line) and the low analog gain reference signal RAMP (dotted line).

A specific operation of imaging the same object with analog gains different from each other is basically similar to that in the case of the fourth example. Further, the configuration in which the conversion efficiency determination threshold is varied by using the variation of the P phase and D phase potentials of each pixel is basically similar to that in the case of the sixth example.

MODIFIED EXAMPLES

The technology according to the present disclosure have been described above on the basis of the preferred embodiment, but the technology of the present disclosure is not limited to the above-mentioned embodiment. The configuration and structure of the imaging element described in the above-mentioned embodiment are exemplary and can appropriately be changed.

For example, in the above-mentioned embodiment, an example in which the technology is applied to the CMOS image sensor including the pixels 2 arranged in a matrix has been described, but the application of the technology according to the present disclosure is not limited to CMOS image sensors. That is, the technology according to the present disclosure is applicable to any X-Y address imaging element including the pixels 2 which is two-dimensionally arranged in a matrix.

Further, in the above-mentioned embodiment, the imaging element which is typified by the CMOS image sensor using the photodiode 21 as the light receiving element of the pixel 2 has been described as an example, but the imaging element according to the above-mentioned embodiment illustrated in FIG. 4 to FIG. 33 can be used as a photodetector element. In the case where the imaging element is used as a photodetector element, as the light receiving element of the pixel 2, an element configured to generate a signal depending on received photons, such as a SPAD (Single Photon Avalanche Diode) element and an event detection sensor called a DVS (Dynamic Vision Sensor), can be used. The event detection sensor detects, as an event, the fact that the luminance change of a pixel exceeds a predetermined threshold.

APPLICATION EXAMPLES

Figure 34:
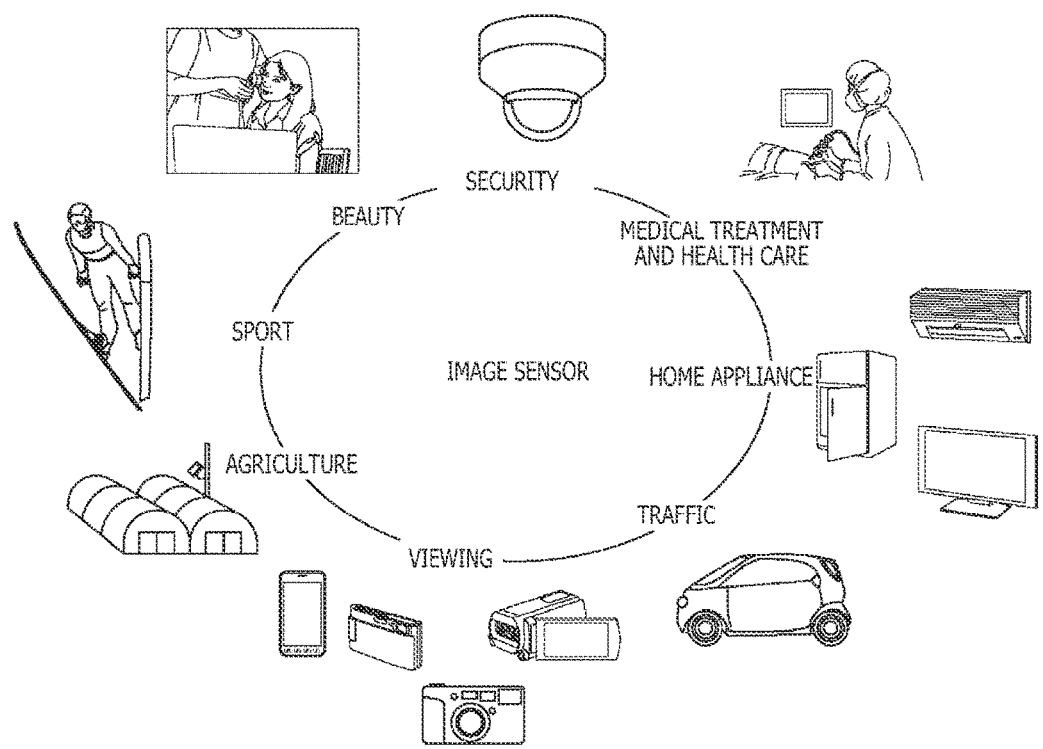
FIG. 34 is a diagram illustrating application examples of the technology according to the present disclosure.

The imaging element according to the present embodiment described above can be used in various apparatuses configured to sense light such as visible light, infrared light, ultraviolet light, or X-rays, as illustrated in FIG. 34, for example. Specific examples of the various apparatuses are enumerated below.

An apparatus configured to capture images for viewing, such as a digital camera and a portable apparatus equipped with a camera function An apparatus provided for traffic, such as an on-vehicle sensor configured to capture the front side, rear side, surroundings, inside, and the like of an automobile for the purpose of supporting safe driving with an automatic stop operation or the like, the purpose of recognizing the driver's conditions, and other purposes, a monitoring camera configured to monitor traveling vehicles and roads, and a ranging sensor configured to measure a distance between vehicles or other objects An apparatus provided for a home appliance such as a TV, a refrigerator, and an air conditioner in order to capture user's gesture and operate the apparatus on the basis of the gesture An apparatus provided for medical treatment and health care, such as an endoscope and an apparatus configured to perform angiography by receiving infrared light An apparatus provided for security, such as a monitoring camera for crime prevention and a camera for personal authentication An apparatus provided for beauty, such as a skin measuring apparatus configured to capture skin and a microscope configured to capture scalps An apparatus provided for sports, such as an action camera and a wearable camera for sport usage or other usage An apparatus provided for agriculture, such as a camera for monitoring the conditions of fields and crops <Application Examples of Technology According to Present Disclosure>

The technology according to the present disclosure is applicable to various products. More specifically, the technology is applicable to imaging apparatuses such as digital still cameras and video cameras, portable terminal apparatuses having an imaging function, such as cell phones, and electronic equipment using an imaging element as an image reading unit, such as copying machines. Now, a case where the technology is applied to an imaging apparatus such as a digital still camera or a video camera is described.

[Electronic Equipment of Present Disclosure]

Figure 35:
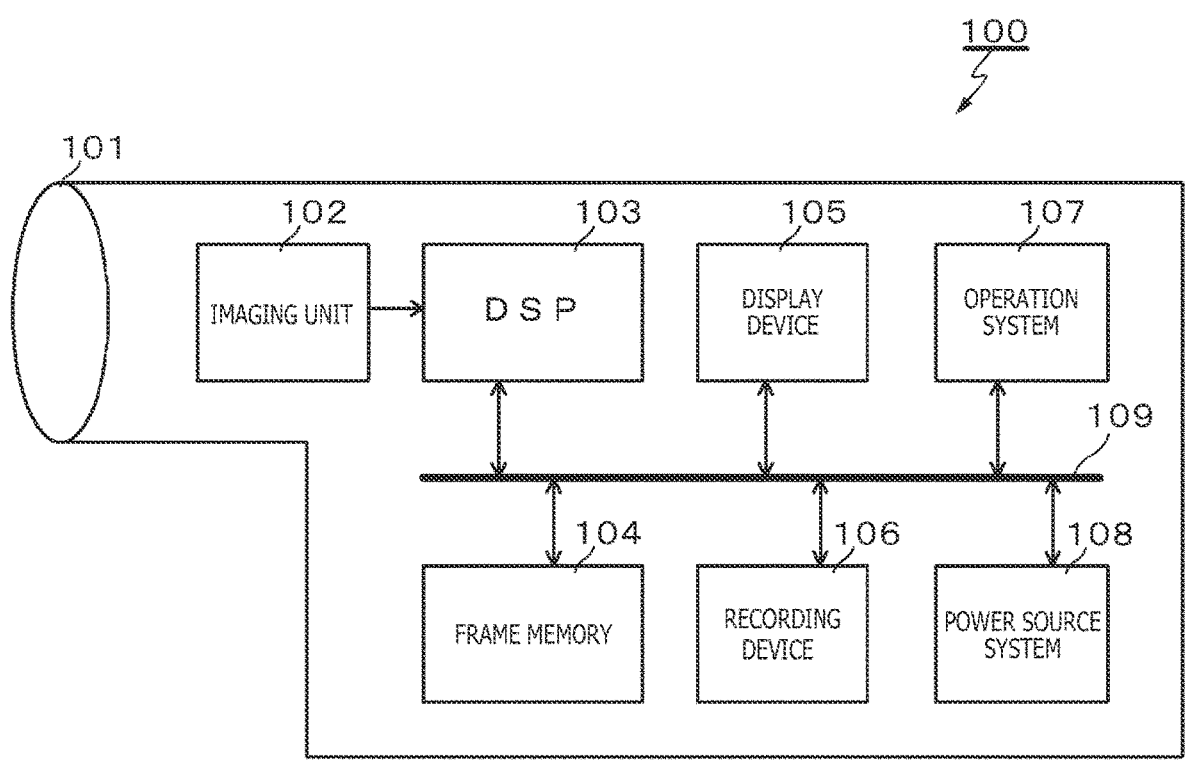
FIG. 35 is a block diagram illustrating the schematic configuration of an imaging apparatus that is an example of electronic equipment of the present disclosure.

FIG. 35 is a block diagram illustrating the configuration of an imaging apparatus that is an example of electronic equipment of the present disclosure. As illustrated in FIG. 35, an imaging apparatus 100 according to the present example includes an imaging optical system 101 including a lens group and the like, an imaging unit 102, a DSP (Digital Signal Processor) circuit 103, a frame memory 104, a display device 105, a recording device 106, an operation system 107, a power source system 108, and the like. Further, the DSP circuit 103, the frame memory 104, the display device 105, the recording device 106, the operation system 107, and the power source system 108 are connected to each other via a bus line 109.

The imaging optical system 101 receives incident light (image light) from an object and forms an image on the imaging plane of the imaging unit 102. The imaging unit 102 converts the amount of incident light which is imaged on the imaging plane by the optical system 101, to an electric signal on a pixel basis, and outputs the electric signal as a pixel signal. The DSP circuit 103 performs general camera signal processing such as white balance processing, demosaic processing, and gamma correction processing.

The frame memory 104 is appropriately used for storing data in the signal processing performed by the DSP circuit 103. The display device 105 includes a panel display device such as a liquid crystal display device or an organic EL (electro luminescence) display device, and displays a moving image or still image captured by the imaging unit 102. The recording device 106 records a moving image or still image captured by the imaging unit 102, on a recording medium such as a portable semiconductor memory, an optical disc, or an HDD (Hard Disk Drive).

The operation system 107 issues operation commands associated with various functions of the imaging apparatus 100, by being operated by the user. The power source system 108 appropriately supplies, to the DSP circuit 103, the frame memory 104, the display device 105, the recording device 106, and the operation system 107, various types of power sources for operating these components.

In the imaging apparatus 100 having the configuration described above, it is possible to use, as the imaging unit 102, the imaging element according to the embodiment described above which can prevent increases in circuit scale and in power consumption and the generation of a pseudo image when dynamic range expansion is to be implemented. Thus, the imaging apparatus 100 using the imaging element as the imaging unit 102 can acquire a high-quality image and contribute to reductions in size and in power consumption.

<Configurations that Present Disclosure can Take>

Note that the present disclosure can also take the following configurations.

<<A. Imaging Element>>

[A-1]

An imaging element including:

an analog-to-digital converter configured to convert multiple analog pixel signals that are acquired under multiple imaging conditions different from each other and that are output from a pixel, to multiple digital pixel signals;

a threshold setting unit configured to set, on an input side of the analog-to-digital converter, a threshold that is randomly varied;

a comparison unit configured to use, as a comparison threshold, the threshold set by the threshold setting unit and compare the comparison threshold with one of the multiple analog pixel signals; and a selection unit configured to select and output, on the basis of a result of comparison from the comparison unit, one of the multiple digital pixel signals that are output from the analog-to-digital converter.

[A-2]

The imaging element according to [A-1], in which the analog-to-digital converter includes a single-slope analog-to-digital converter configured to perform analog-to-digital conversion by using a ramp waveform reference signal having a voltage value that changes over time.

[A-3]

The imaging element according to [A-2], in which the single-slope analog-to-digital converter includes a comparator configured to compare the multiple analog pixel signals that are output from the pixel, with the ramp waveform reference signal, and a counter configured to measure a period of time from a start time when the comparator starts a comparison operation to an end time when the comparator ends the comparison operation.

[A-4]

The imaging element according to [A-3], in which the threshold setting unit sets the randomly varied threshold by controlling an auto-zero period in which input and output terminals of the comparator are short-circuited.

[A-5]

The imaging element according to [A-3], in which the threshold setting unit sets the randomly varied threshold by controlling a bias current in the comparator.

[A-6]

The imaging element according to [A-3], in which the threshold setting unit sets the randomly varied threshold by changing a size ratio (channel width/channel length) of differential pair transistors included in the comparator.

[A-7]

The imaging element according to any one of [A-1] to [A-6], in which the imaging element sequentially images the same object by using a single pixel while changing an imaging condition, to acquire multiple analog pixel signals, or simultaneously images the same object by using multiple pixels having different imaging conditions, to acquire multiple analog pixel signals.

[A-8]

The imaging element according to [A-7], in which the imaging condition includes an exposure, an exposure time, conversion efficiency with which a charge is converted to a voltage, or sensitivity of the pixel.

[A-9]
The imaging element according to [A-8], in which,
when the multiple imaging conditions include high conversion efficiency and low conversion efficiency, and
when the pixel sequentially outputs a P phase signal at a reset level of a floating diffusion FD being reset and a D phase signal at a signal level based on photoelectric conversion performed by a light receiving element,
a single-slope analog-to-digital converter performs an operation of acquiring a count value of the P phase signal at low conversion efficiency from a counter to temporarily hold the count value and restoring the count value to the counter before counting the D phase signal at low conversion efficiency.

[A-10]
The imaging element according to [A-9], in which
the single-slope analog-to-digital converter includes two sets of a comparator and a counter in each pixel column, the two sets being arranged in parallel.

[A-11]
The imaging element according to [A-10], in which
the single-slope analog-to-digital converter includes an adaptive attenuation analog-to-digital converter configured to attenuate, when an amplitude of each of the analog pixel signals that are output from the pixel is relatively large, the amplitude by a predetermined amount to compress a dynamic range.

[A-12]
The imaging element according to [A-11], in which
the adaptive attenuation analog-to-digital converter includes, on an input side of the comparator, a sample-and-hold circuit configured to sample and hold the P phase signal at low conversion efficiency.

[A-13]
The imaging element according to any one of [A-1] to [A-6], in which,
when the imaging conditions include an analog gain of the analog-to-digital converter, a single analog-to-digital converter sequentially performs analog-to-digital conversion while changing the analog gain, or multiple analog-to-digital converters having different analog gains simultaneously performs analog-to-digital conversion.

[A-14]
The imaging element according to [A-13], in which,
when the multiple imaging conditions include a high analog gain and a low analog gain, and
when the pixel sequentially outputs a P phase signal at a reset level of a floating diffusion FD being reset and a D phase signal at a signal level based on photoelectric conversion performed by a light receiving element,
a single-slope analog-to-digital converter performs an operation of acquiring a count value of the P phase signal with a low analog gain from a counter to temporarily hold the count value and restoring the count value to the counter before counting the D phase signal with a low analog gain.

[A-15]
The imaging element according to [A-13], in which
the single-slope analog-to-digital converter includes two sets of a comparator and a counter in each pixel column, the two sets being arranged in parallel.

[A-16]
The imaging element according to [A-1] or [A-2], in which,
when the pixel sequentially outputs a P phase signal at a reset level of a floating diffusion FD being reset and a D phase signal at a signal level based on photoelectric conversion performed by a light receiving element, the threshold setting unit sets the randomly varied threshold by using a variation of potentials of the P phase signal and the D phase signal of each pixel.

[A-17]
The imaging element according to [A-16], in which,
when the multiple imaging conditions include high conversion efficiency and low conversion efficiency, a single-slope analog-to-digital converter includes a high conversion efficiency analog-to-digital converter and a low conversion efficiency analog-to-digital converter, and
the high conversion efficiency analog-to-digital converter and the low conversion efficiency analog-to-digital converter each include
a D phase count value latch,
a comparison unit for determining a level of output of the latch, and
a selector configured to select, on the basis of a result of comparison from the comparison unit, either output of the high conversion efficiency analog-to-digital converter or output of the low conversion efficiency analog-to-digital converter.

[A-18]
The imaging element according to [A-16], in which,
when the multiple imaging conditions include a high analog gain and a low analog gain, a single-slope analog-to-digital converter includes a high-analog-gain analog-to-digital converter and a low analog gain analog-to-digital converter, and
the high-analog-gain analog-to-digital converter and the low analog gain analog-to-digital converter each include
a D phase count value latch,
a comparison unit for determining a level of output of the latch, and
a selector configured to select, on the basis of a result of comparison from the comparison unit, either output of the high-analog-gain analog-to-digital converter or output of the low analog gain analog-to-digital converter.

<B. Electronic Equipment>>
[B-1]
Electronic equipment including:
an imaging element that includes
an analog-to-digital converter configured to convert multiple analog pixel signals that are acquired under multiple imaging conditions different from each other and that are output from a pixel, to multiple digital pixel signals,
a threshold setting unit configured to set, on an input side of the analog-to-digital converter, a threshold that is randomly varied,
a comparison unit configured to use, as a comparison threshold, the threshold set by the threshold setting unit and compare the comparison threshold with one of the multiple analog pixel signals, and
a selection unit configured to select and output, on the basis of a result of comparison from the comparison unit, one of the multiple digital pixel signals that are output from the analog-to-digital converter.

[B-2]
The electronic equipment according to [B-1], in which
the analog-to-digital converter includes a single-slope analog-to-digital converter configured to perform analog-to-digital conversion by using a ramp waveform reference signal having a voltage value that changes over time.

[B-3]
The electronic equipment according to [B-2], in which
the single-slope analog-to-digital converter includes a comparator configured to compare the multiple analog pixel signals that are output from the pixel, with the ramp waveform reference signal, and a counter configured to measure a period of time from a start time when the comparator starts a comparison operation to an end time when the comparator ends the comparison operation.

[B-4]

The electronic equipment according to [B-3], in which the threshold setting unit sets the randomly varied threshold by controlling an auto-zero period in which input and output terminals of the comparator are short-circuited.

[B-5]

The electronic equipment according to [B-3], in which the threshold setting unit sets the randomly varied threshold by controlling a bias current in the comparator.

[B-6]

The electronic equipment according to [B-3], in which the threshold setting unit sets the randomly varied threshold by changing a size ratio (channel width/channel length) of differential pair transistors included in the comparator.

[B-7]

The electronic equipment according to any one of [B-1] to [B-6], in which the electronic equipment sequentially images the same object by using a single pixel while changing an imaging condition, to acquire multiple analog pixel signals, or simultaneously images the same object by using multiple pixels having different imaging conditions, to acquire multiple analog pixel signals.

[B-8]

The electronic equipment according to [B-7], in which the imaging condition includes an exposure, an exposure time, conversion efficiency with which a charge is converted to a voltage, or sensitivity of the pixel.

[B-9]

The electronic equipment according to [B-8], in which, when the multiple imaging conditions include high conversion efficiency and low conversion efficiency, and when the pixel sequentially outputs a P phase signal at a reset level of a floating diffusion FD being reset and a D phase signal at a signal level based on photoelectric conversion performed by a light receiving element, a single-slope analog-to-digital converter performs an operation of acquiring a count value of the P phase signal at low conversion efficiency from a counter to temporarily hold the count value and restoring the count value to the counter before counting the D phase signal at low conversion efficiency.

[B-10]

The electronic equipment according to [B-9], in which the single-slope analog-to-digital converter includes two sets of a comparator and a counter in each pixel column, the two sets being arranged in parallel.

[B-11]

The electronic equipment according to [B-10], in which the single-slope analog-to-digital converter includes an adaptive attenuation analog-to-digital converter configured to attenuate, when an amplitude of each of the analog pixel signals that are output from the pixel is relatively large, the amplitude by a predetermined amount to compress a dynamic range.

[B-12]

The electronic equipment according to [B-11], in which the adaptive attenuation analog-to-digital converter includes, on an input side of the comparator, a sample-and-hold circuit configured to sample and hold the P phase signal at low conversion efficiency.

[B-13]

The electronic equipment according to any one of [B-1] to [B-6], in which, when the imaging conditions include an analog gain of the analog-to-digital converter, a single analog-to-digital converter sequentially performs analog-to-digital conversion while changing the analog gain, or multiple analog-to-digital converters having different analog gains simultaneously performs analog-to-digital conversion.

[B-14]

The electronic equipment according to [B-13], in which, when the multiple imaging conditions include a high analog gain and a low analog gain, and when the pixel sequentially outputs a P phase signal at a reset level of a floating diffusion FD being reset and a D phase signal at a signal level based on photoelectric conversion performed by a light receiving element, a single-slope analog-to-digital converter performs an operation of acquiring a count value of the P phase signal with a low analog gain from a counter to temporarily hold the count value and restoring the count value to the counter before counting the D phase signal with a low analog gain.

[B-15]

The electronic equipment according to [B-13], in which the single-slope analog-to-digital converter includes two sets of a comparator and a counter in each pixel column, the two sets being arranged in parallel.

[B-16]

The electronic equipment according to [B-1] or [B-2], in which, when the pixel sequentially outputs a P phase signal at a reset level of a floating diffusion FD being reset and a D phase signal at a signal level based on photoelectric conversion performed by a light receiving element, the threshold setting unit sets the randomly varied threshold by using a variation of potentials of the P phase signal and the D phase signal of each pixel.

[B-17]

The electronic equipment according to [B-16], in which, when the multiple imaging conditions include high conversion efficiency and low conversion efficiency, a single-slope analog-to-digital converter includes a high conversion efficiency analog-to-digital converter and a low conversion efficiency analog-to-digital converter, and the high conversion efficiency analog-to-digital converter and the low conversion efficiency analog-to-digital converter each include a D phase count value latch, a comparison unit for determining a level of output of the latch, and a selector configured to select, on the basis of a result of comparison from the comparison unit, either output of the high conversion efficiency analog-to-digital converter or output of the low conversion efficiency analog-to-digital converter.

[B-18]

The electronic equipment according to [B-16], in which, when the multiple imaging conditions include a high analog gain and a low analog gain, a single-slope analog-to-digital converter includes a high-analog-gain analog-to-digital converter and a low analog gain analog-to-digital converter, and the high-analog-gain analog-to-digital converter and the low analog gain analog-to-digital converter each include
a D phase count value latch,
a comparison unit for determining a level of output of the latch, and
a selector configured to select, on the basis of a result of comparison from the comparison unit, either output of the high-analog-gain analog-to-digital converter or output of the low analog gain analog-to-digital converter.

REFERENCE SIGNS LIST

1: CMOS image sensor
2: Pixel
11: Pixel array unit
12: Row selection unit
13: Constant current source unit
14: Analog-to-digital conversion unit
15: Horizontal transfer scanning unit
16: Signal processing unit
17: Timing control unit
18: Horizontal transfer line
19: Reference signal generation unit
21: Photodiode
22: Transfer transistor
23: Reset transistor
24: Amplification transistor
25: Selection transistor
($31_1$ to $31_m$): Pixel control line
($32_1$ to $32_n$): Vertical signal line
141: Comparator
142: Counter
143: Data latch
144: Threshold setting unit
145: Comparison unit
146: Determination flag storage latch
147: Selector (selection unit)

The invention claimed is:

1. An imaging element comprising:
an analog-to-digital converter configured to convert multiple analog pixel signals that are acquired under multiple imaging conditions different from each other and that are output from a pixel, to multiple digital pixel signals;
a threshold setting unit configured to set, on an input side of the analog-to-digital converter, a threshold that is randomly varied;
a comparison unit configured to use, as a comparison threshold, the threshold set by the threshold setting unit and compare the comparison threshold with one of the multiple analog pixel signals; and
a selection unit configured to select and output, based on a result of comparison from the comparison unit, one of the multiple digital pixel signals that are output from the analog-to-digital converter.

2. The imaging element according to claim 1, wherein the analog-to-digital converter includes a single-slope analog-to-digital converter configured to perform analog-to-digital conversion based on a ramp waveform reference signal having a voltage value that changes over time.

3. The imaging element according to claim 2, wherein the single-slope analog-to-digital converter includes
a comparator configured to compare the multiple analog pixel signals that are output from the pixel, with the ramp waveform reference signal, and a counter configured to measure a period of time from a start time when the comparator starts a comparison operation to an end time when the comparator ends the comparison operation.

4. The imaging element according to claim 3, wherein the threshold setting unit is further configured to set the randomly varied threshold by controlling an auto-zero period in which input and output terminals of the comparator are short-circuited.

5. The imaging element according to claim 3, wherein the threshold setting unit is further configured to set the randomly varied threshold by controlling a bias current in the comparator.

6. The imaging element according to claim 3, wherein the threshold setting unit is further configured to set the randomly varied threshold by changing a size ratio (channel width/channel length) of differential pair transistors included in the comparator.

7. The imaging element is further configured to according to claim 1, wherein
the imaging element is further configured to sequentially image a same object by using a single pixel while changing an imaging condition, to acquire multiple analog pixel signals, or simultaneously images the same object by using multiple pixels having different imaging conditions, to acquire multiple analog pixel signals.

8. The imaging element according to claim 7, wherein the imaging condition includes an exposure, an exposure time, conversion efficiency with which a charge is converted to a voltage, or sensitivity of the pixel.

9. The imaging element according to claim 8, wherein when the multiple imaging conditions include high conversion efficiency and low conversion efficiency, and
when the pixel sequentially outputs a P phase signal at a reset level of a floating diffusion FD being reset and a D phase signal at a signal level based on photoelectric conversion performed by a light receiving element,
a single-slope analog-to-digital converter configured to perform an operation to acquire a count value of the P phase signal at low conversion efficiency from a counter to temporarily hold the count value and restoring the count value to the counter before counting the D phase signal at low conversion efficiency.

10. The imaging element according to claim 9, wherein the single-slope analog-to-digital converter includes two sets of a comparator and a counter in each pixel column, the two sets being arranged in parallel.

11. The imaging element according to claim 10, wherein the single-slope analog-to-digital converter includes an adaptive attenuation analog-to-digital converter configured to attenuate, based on an amplitude of each of the analog pixel signals that are output from the pixel is relatively large, the amplitude by a predetermined amount to compress a dynamic range.

12. The imaging element according to claim 11, wherein the adaptive attenuation analog-to-digital converter includes, on an input side of the comparator, a sample-and-hold circuit configured to sample and hold the P phase signal at low conversion efficiency.

13. The imaging element according to claim 1, wherein when the imaging conditions include an analog gain of the analog-to-digital converter, a single analog-to-digital converter configured to sequentially perform analog-to-digital conversion while changing the analog gain, or multiple analog-to-digital converters having different analog gains simultaneously performs analog-to-digital conversion.

14. The imaging element according to claim 13, wherein
when the multiple imaging conditions include a high analog gain and a low analog gain, and
when the pixel sequentially outputs a P phase signal at a reset level of a floating diffusion FD being reset and a D phase signal at a signal level based on photoelectric conversion performed by a light receiving element,
a single-slope analog-to-digital converter configured to perform an operation to acquire a count value of the P phase signal with a low analog gain from a counter to temporarily hold the count value and restoring the count value to the counter before counting the D phase signal with a low analog gain.

15. The imaging element according to claim 13, wherein the single-slope analog-to-digital converter includes two sets of a comparator and a counter in each pixel column, the two sets being arranged in parallel.

16. The imaging element according to claim 1, wherein when the pixel sequentially outputs a P phase signal at a reset level of a floating diffusion FD being reset and a D phase signal at a signal level based on photoelectric conversion performed by a light receiving element, the threshold setting unit is further configured to set the randomly varied threshold by using a variation of potentials of the P phase signal and the D phase signal of each pixel.

17. The imaging element according to claim 16, wherein
when the multiple imaging conditions include high conversion efficiency and low conversion efficiency, a single-slope analog-to-digital converter includes a high conversion efficiency analog-to-digital converter and a low conversion efficiency analog-to-digital converter, and
the high conversion efficiency analog-to-digital converter and the low conversion efficiency analog-to-digital converter each include:
a D phase count value latch,
a comparison unit for determining a level of output of the latch, and
a selector configured to select, based on a result of comparison from the comparison unit, either output of the high conversion efficiency analog-to-digital converter or output of the low conversion efficiency analog-to-digital converter.

18. The imaging element according to claim 16, wherein when the multiple imaging conditions include a high analog gain and a low analog gain, a single-slope analog-to-digital converter includes a high-analog-gain analog-to-digital converter and a low analog gain analog-to-digital converter, and
the high-analog-gain analog-to-digital converter and the low analog gain analog-to-digital converter each include
a D phase count value latch,
a comparison unit for determining a level of output of the latch, and
a selector configured to select, based on a result of comparison from the comparison unit, either output of the high-analog-gain analog-to-digital converter or output of the low analog gain analog-to-digital converter.

19. A photodetector element, comprising:
an analog-to-digital converter configured to convert multiple analog pixel signals that are acquired under multiple imaging conditions different from each other and that are output from a pixel, to multiple digital pixel signals;
a threshold setting unit configured to set, on an input side of the analog-to-digital converter, a threshold that is randomly varied;
a comparison unit configured to use, as a comparison threshold, the threshold set by the threshold setting unit and compare the comparison threshold with one of the multiple analog pixel signals; and
a selection unit configured to select and output, based on a result of comparison from the comparison unit, one of the multiple digital pixel signals that are output from the analog-to-digital converter.

20. Electronic equipment, comprising:
an imaging element that includes:
an analog-to-digital converter configured to convert multiple analog pixel signals that are acquired under multiple imaging conditions different from each other and that are output from a pixel, to multiple digital pixel signals,
a threshold setting unit configured to set, on an input side of the analog-to-digital converter, a threshold that is randomly varied,
a comparison unit configured to use, as a comparison threshold, the threshold set by the threshold setting unit and compare the comparison threshold with one of the multiple analog pixel signals, and
a selection unit configured to select and output, based on a result of comparison from the comparison unit, one of the multiple digital pixel signals that are output from the analog-to-digital converter.

* * * * *